(12) United States Patent
Ozawa et al.

(10) Patent No.: US 7,379,639 B2
(45) Date of Patent: May 27, 2008

(54) LENS ASSEMBLY AND ELECTRONIC APPARATUS USING THE SAME

(75) Inventors: Ken Ozawa, Kanagawa (JP); Kazuharu Inoue, Kanagawa (JP)

(73) Assignee: Sony Corporation, Tokyo (JP)

( * ) Notice: Subject to any disclaimer, the term of this patent is extended or adjusted under 35 U.S.C. 154(b) by 23 days.

(21) Appl. No.: 11/361,250

(22) Filed: Feb. 23, 2006

(65) Prior Publication Data
US 2006/0187798 A1    Aug. 24, 2006

(30) Foreign Application Priority Data
Feb. 23, 2005    (JP)    ............................ P2005-047870

(51) Int. Cl.
G02B 6/32    (2006.01)
(52) U.S. Cl. ...................................... 385/33
(58) Field of Classification Search .................. 385/33
See application file for complete search history.

(56) References Cited
U.S. PATENT DOCUMENTS
6,580,856 B1 *    6/2003    Wade ........................... 385/37

2002/0181929 A1*    12/2002    Hsieh et al. ................. 385/140
2003/0169963 A1*    9/2003    Zhou ........................... 385/22
2003/0219203 A1*    11/2003    Zhou ........................... 385/33
2006/0239605 A1*    10/2006    Palen et al. ................... 385/14

OTHER PUBLICATIONS

Ishii et al., "Large-Tolerant "OptoBump" Interface for Interchip Optical Interconnections," vol. J64-C, No. 9, (2001) pp. 793-799.

* cited by examiner

*Primary Examiner*—Michelle Connelly-Cushwa
*Assistant Examiner*—Chris Chu
(74) *Attorney, Agent, or Firm*—Bell, Boyd & Lloyd LLP

(57) ABSTRACT

A lens assembly for transmitting an optical signal has a light-emitting element that diffuses the optical signal and a collimator lens that converts the optical signal diffused out of the light-emitting element from its diffused light into parallel light. The device also has a condenser lens that gathers the parallel light output from the collimator lens to focus the parallel light into an opening of an optical waveguide. The opening is provided in an end of the optical waveguide. An optical axis of the condenser lens is shifted toward the other 10 end of the waveguide by a predetermined distance with respect to an optical axis of the collimator lens.

2 Claims, 30 Drawing Sheets

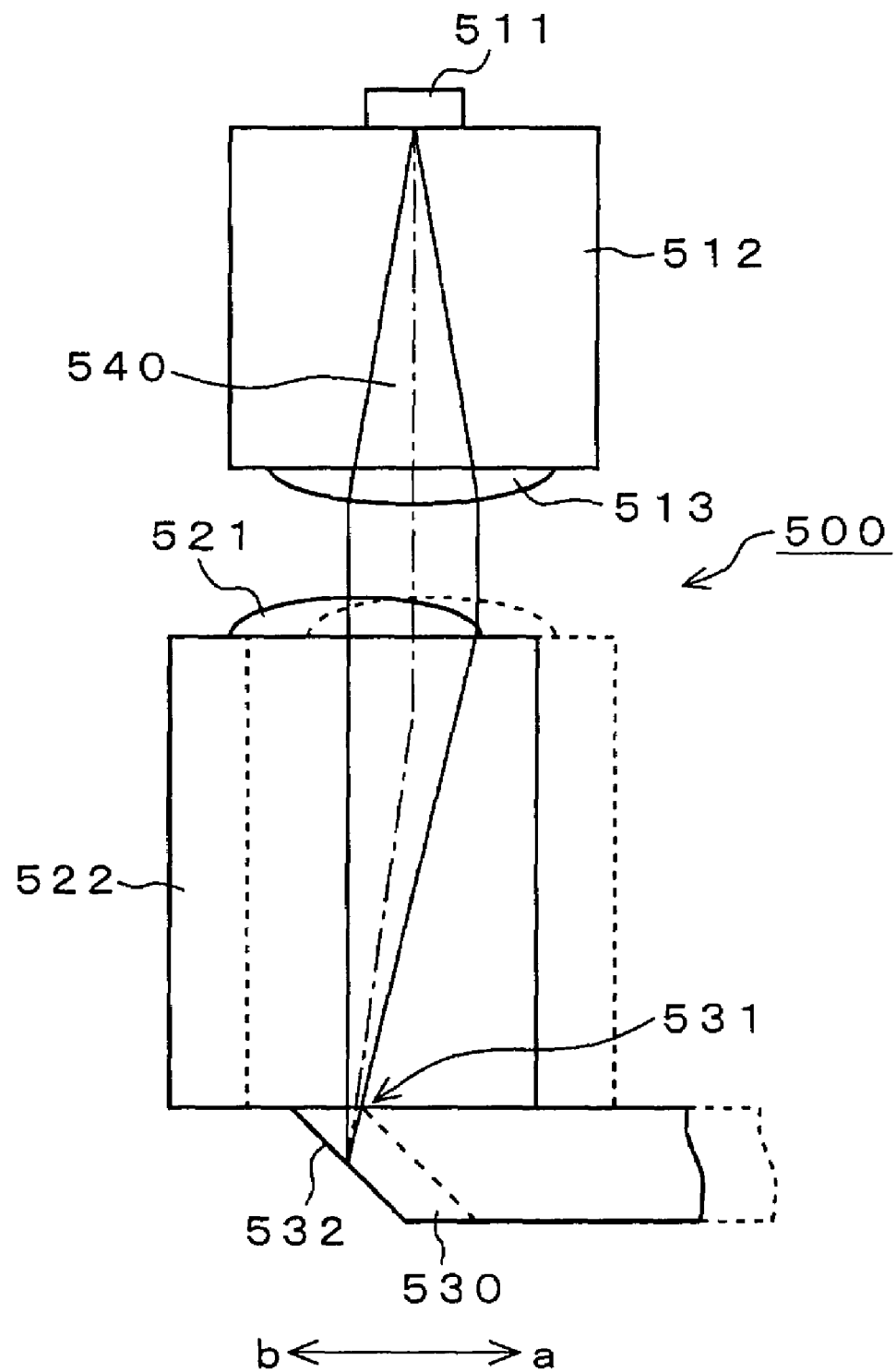

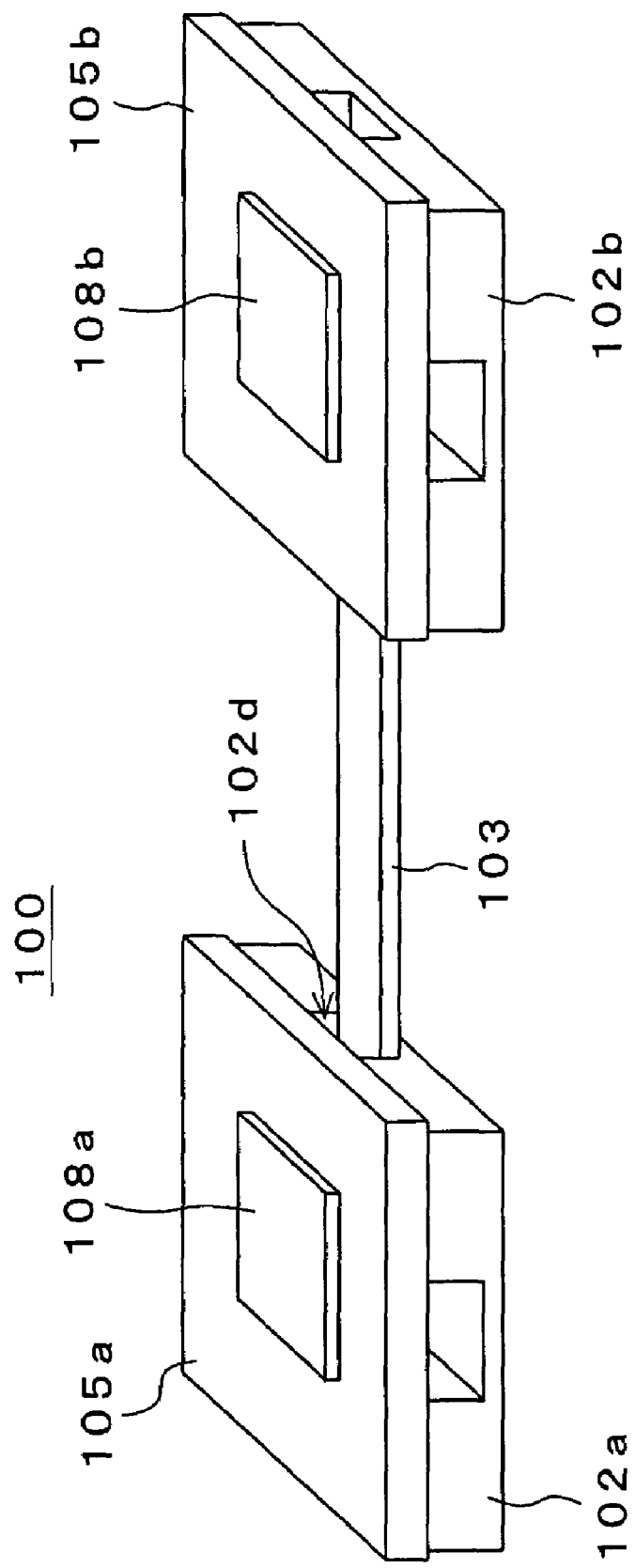

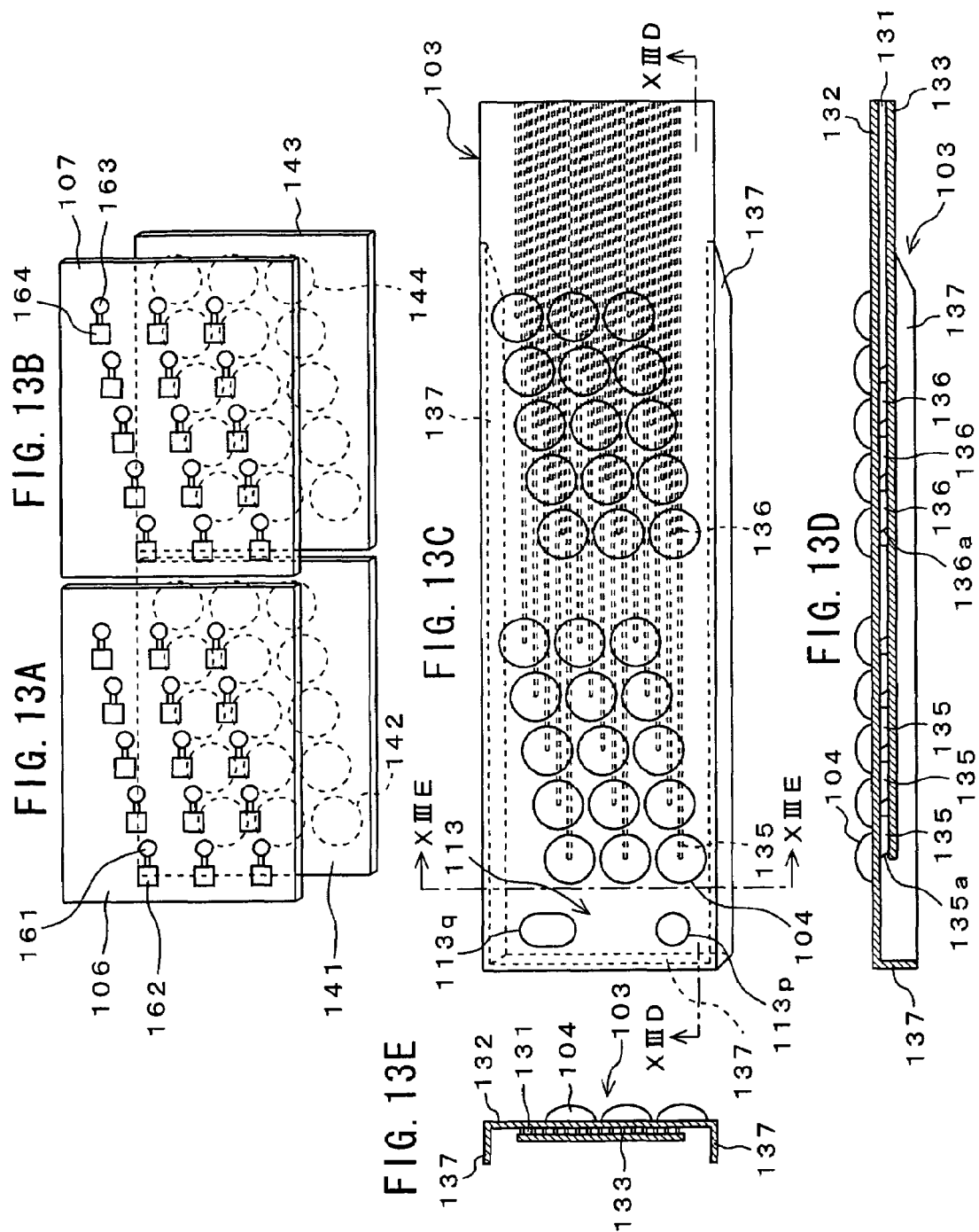

FIG. 22
| | COLLIMATOR LENS | CONDENSER LENS |
|---|---|---|
| Cv | -4.8476723 | 4.7853988 |
| K | -1.0007694 | -0.4190156 |
| A | -7.3220784 | -1.3854491 |
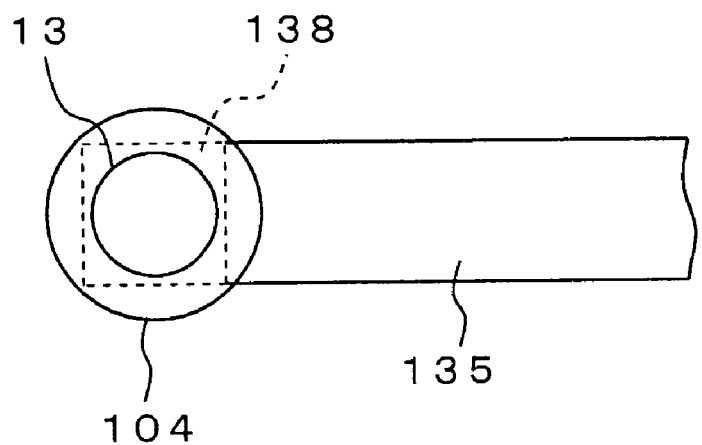
FIG. 23A
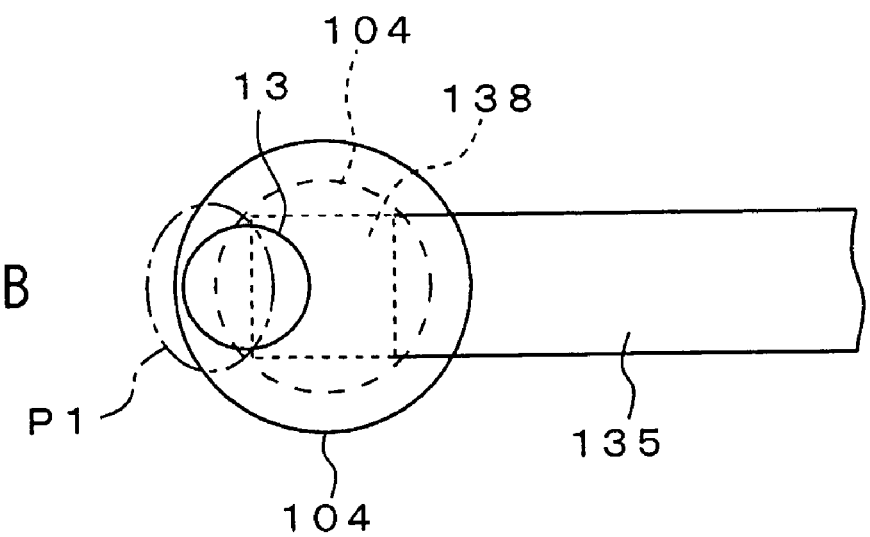
FIG. 23B

LENS ASSEMBLY AND ELECTRONIC APPARATUS USING THE SAME

CROSS REFERENCE TO RELATED APPLICATION

The present application claims priority to Japanese Patent Application No. JP2005-047870 filed on Feb. 23, 2005, the entire contents of which being incorporated herein by reference.

BACKGROUND

The present invention relates to a lens assembly and an electronic apparatus using the same. More specifically, the present invention relates to a device for transmitting an optical signal as the lens assembly and the like that are preferably applicable to any signal transmission between semiconductor chips such as large scale integrated (LSI) circuits.

Elements such as transistors and capacitors produced on a silicon substrate in an LSI chip at a front end thereof or blocks including such the elements have been wired and connected to each other at a back end thereof for transmitting a signal and supplying power by electric transmission using metal line produced on an insulating substrate. Accompanying, however, with speed-up in element operation based on current enhanced micromachining of scale, namely, high performance of a micro processing unit (MPU), a large amount of data, to be received in the chip, is necessary for being processed very rapidly, so that operation clock speed of the chip is remarkably increased.

Various issues have been arisen in metal wiring that electrically distributes the data and operation clock signal. As typical issues, have been risen any register and capacitor (RC) signal delay based on resistance and parasitic capacitance of the metal wiring, any impedance mismatching, electromagnetic/compatibility (EMC)/electromagnetic interference (EMI), any signal degradation due to cross talk or the like, any transmission error, increase of consumed power that is necessary for transmitting a signal based on any remarkable enhanced micromachining, increase of wiring length based on multilayer, deterioration of yield rate and the like.

As one of implementation techniques to solve such the issues, an optical interconnection between chips that LSI chips on a board are directly and optically connected to each other has been known. In order to realize such the optical interconnection between chips, an optical I/O package such that a beam output from a vertical cavity-surface emitting laser (hereinafter, referred to as "VCSEL") is once collimated to focus at its incident to the waveguide has been proposed (see institute of electronics, information and communication engineers (IEICE) transaction C, pp. 793-799 (2001) Vol. J64-C, No. 9). FIG. 1 shows a configuration of a lens assembly, i.e., a device 500 for transmitting an optical signal as the optical I/O package. This device 500 has a VCSEL 511, as a light-emitting element, for diffusing an optical signal, a lens base 512 of VCSEL side, a collimator lens 513 for converting the optical signal diffused out of the VCSEL 511 from its diffused light into parallel light, a condenser lens 521 for gathering the parallel light output from the collimator lens 513 to focus the parallel light into an opening 531 of an optical waveguide 530, which is provided in an end of the optical waveguide 530, and a lens base 522 of waveguide side.

The optical signal (laser light) 540 diffused out of the VCSEL 511 is incident into the collimator lens 513, through the lens base 512, by which it is converted from its diffused light into the parallel light. The parallel light is also incident into the condenser lens 521 by which the parallel light is focused into the opening 531 of an optical waveguide 530, which is provided in an end of the optical waveguide 530, through the lens base 522. A mirror surface 532 having an inclined angle of 45 degrees then reflects the optical signal that has been focused into the opening 531. The waveguide 530 then guides the reflected optical signal along it.

According to the device 500 for transmitting the optical signal, for example, as shown in FIG. 2, even if a manufacture tolerance occurs and the waveguide 530 is shifted with respect to the VCSEL 511, a light path of the optical signal that is incident to the condenser lens 521 is also bended so that it is focused into the opening 531 of the waveguide 530, thereby configuring a lens module that is flexibly applicable to such the tolerance and has less transmission loss. It is to be noted that dotted line shown in FIG. 2 indicates positions of the condenser lens 521, the lens base 522, the waveguide 530 and the like if no manufacture tolerance occur.

The device 500 for transmitting the optical signal, shown in FIG. 1, can get sufficient coupling efficiency in transmission of the optical signal (laser light) from VCSEL 511 up to the opening 531 of the waveguide 530. If, however, perfect reflection of the optical signal that has been incident to the mirror surface 532 in the waveguide 530 is considered, it may be considered that a part of the optical signal passes through the mirror surface 532, not reflected by it, according to a shift direction of the parallel light that is incident to the condenser lens 521.

For example, it may be considered that, as shown in FIG. 3, occurrence of any manufacture tolerance causes parallel light that is incident to the condenser lens 521 to be shifted in a direction, "a" shown in FIG. 3 (that is, a reverse direction of a shifted direction, "b" shown in FIG. 2). In also this case, the device 500 can also get sufficient coupling efficiency in transmission of the optical signal (laser light) from the VCSEL 511 up to the opening 531 of the waveguide 530.

An incident angle of the optical signal, which has been focused into the waveguide 530, with respect to the mirror surface 532 becomes near 90 degrees with respect to this mirror surface 532. If a region in which the mirror surface 532 perfectly reflects the optical signal is estimated to αa as shown in FIG. 4, light that stays in a region αb, out of the region αa, fails to be reflected by the mirror surface 532 and passes through this mirror surface 532, so that the waveguide 530 cannot guide and transmit it. Thus, all the light within the region αb will be loss. In other words, an issue has been arisen such that when an incident angle of optical signal to the mirror surface 532 in the waveguide 530 is near 90 degrees, it is difficult to satisfy a perfect reflection condition by the mirror surface 532, thereby increasing loss in the amount of light.

Further, in order to decrease light that falls outside the region αa, it is estimated that NA of input light to the waveguide 530 is decreased. It is generally designed to make a light source and the mirror configured so as to become a conjugation relationship therebetween (i.e. to form an optical image thereon) in order to adjust angle shift in the light source, the collimator lens, and the waveguide. Herein, in order to decrease NA of the condenser lens 521, it is necessary to expand focal distance of the condenser lens 521.

Relationship between a focal distance of imaging lens and imaging factor is represented as following equation: imaging magnification S2=focal distance of image side/focal distance s1 of object side (see FIG. 5). Thus, the focal distance of imaging lens (focal distance of image side) and the imaging magnification have proportionality relation so that the larger the focal distance of condenser lens 521, the imaging magnification of an image of light source in the mirror surface 532 becomes larger. In other words, if NA of the condenser lens 521 becomes smaller, a size of the image of light source (hereinafter, referred to as "focal diameter") in the opening 531 of the waveguide 530 becomes larger.

FIG. 6 shows a case where NA of the condenser lens 521 becomes smaller. In this case, as shown in FIG. 7A, all the light of optical signal 540 stays within the region αa. In this case, however, NA of the condenser lens 521 becomes smaller, so that loss on amount of light occurs since the focal diameter Da fails to be included in the opening 531 of the waveguide 530. It is to be noted that a focal diameter Db shown in FIG. 7B indicates one relative to NA of the condenser lens 521 shown in FIG. 3.

Thus, if, in the device 500 for transmitting the optical signal, which has been shown in FIG. 1, NA of the condenser lens 521 becomes smaller in order to reduce the loss on the mirror surface 532 in the waveguide 530, an amount of light rejected at the opening 531 of the waveguide 530 increases while if NA of the condenser lens 521 becomes larger to make its imaging magnitude smaller in order to reduce an amount of light rejected at the opening 531 of the waveguide 530, an amount of the light passing through the mirror surface 532 increases without performing any perfect reflection on the mirror surface 532 when any manufacture tolerance occurs.

SUMMARY

It is desirable to satisfy conditions of perfect reflections for the optical signal that is incident to the mirror surface without decreasing NA of the imaging lens.

According to an embodiment of the present invention, there is provided a lens assembly for transmitting an optical signal. The lens assembly has a light-emitting element that diffuses the optical signal. The lens assembly also has a collimator lens that converts the optical signal diffused out of the light-emitting element from its diffused light into parallel light. The lens assembly further has a condenser lens that gathers the parallel light output from the collimator lens to focus the parallel light into an opening of an optical waveguide. The opening is provided in an end of the optical waveguide. An optical axis of the condenser lens is shifted toward the other end of the waveguide by a predetermined distance with respect to an optical axis of the collimator lens.

According to another embodiment of the present invention, there is provided an electronic apparatus having plural electronic components and a lens assembly for transmitting an optical signal into an optical waveguide. First and second electronic components included in the plural electronic components transmit the optical signal to each other. Such the lens assembly includes a light-emitting element that diffuses the optical signal. The lens assembly also includes a collimator lens that converts the optical signal diffused out of the light-emitting element from its diffused light into parallel light. The lens assembly further includes a condenser lens that gathers the parallel light output from the collimator lens to focus the parallel light into an opening of an optical waveguide, which is provided in an end of the optical waveguide. An optical axis of the condenser lens is shifted toward the other end of the waveguide by a predetermined distance with respect to an optical axis of the collimator lens.

According to embodiments of the invention, the collimator lens converts the optical signal diffused out of the lightemitting element from its diffused light into parallel light. The condenser lens then gathers and focuses the parallel light into an opening of an optical waveguide, which is provided in an end of the optical waveguide. The optical axis of the condenser lens is shifted toward the other end of the optical waveguide by a predetermined distance with respect to an optical axis of the collimator lens. In this case, the parallel light is shifted so that its main beam can be positioned away from the optical axis of the condenser lens toward the end of the optical waveguide by the predetermined distance.

For example, such the predetermined distance is set so as to put a main beam of the optical signal on a position of a first line. Such the optical signal is incident to an inclined mirror surface to which the optical signal diffused into the optical waveguide through the opening is incident. The first line halves a region covering from a second line indicating a critical angle with respect to the mirror surface to a third line extending along the mirror surface.

Alternatively, for example, the predetermined distance is set so as to bring an incline of a main beam of the optical signal with respect to the optical axis of the condenser lens, not larger than an incline of a first line with respect to the optical axis of the condenser lens. Such optical signal is incident to an inclined mirror surface to which the optical signal diffused into the optical waveguide through the opening is incident. The above first line halves a region covering from a second line indicating a critical angle with respect to the mirror surface to a third line extending along the mirror surface.

Thus, shifting the optical axis of the condenser lens toward the other end of the optical waveguide by a predetermined distance with respect to an optical axis of the collimator lens allows the optical signal that is incident to the mirror surface to satisfy its conditions of perfect reflections without decreasing NA of the imaging lens. Since this avoids decreasing NA of the imaging lens, a focal diameter is not made larger at the opening of the optical waveguide nor the amount of light rejected at the opening of the optical waveguide increases.

Further, shifting the optical axis of the condenser lens toward the other end of the optical waveguide by a predetermined distance with respect to an optical axis of the collimator lens allows an allowable region of manufacture tolerance to be made wider, thereby configuring a lens module and the like that are flexibly applicable to such the tolerance. It is to be noted that in order to make the allowable region of manufacture tolerance widest, the main beam of the optical signal, which is incident to an inclined mirror surface to which the optical signal diffused into the optical waveguide through the opening is incident, is put on a position of a first line halving a region covering from a second line indicating a critical angle with respect to the mirror surface to a third line extending along the mirror surface.

Additional features and advantages are described herein, and will be apparent from, the following Detailed Description and the figures.

BRIEF DESCRIPTION OF THE FIGURES

FIG. 6 is a diagram for illustrating a lens assembly for transmitting an optical signal, as related one, when NA of condenser lens is decreased.

FIG. 9 is a schematic perspective diagram for showing an embodiment of the photoelectric composite apparatus according to the invention.

FIG. 13A is a diagram for showing a light-emitting element array, FIG. 13B is a diagram for showing a light-receiving element array, FIG. 13C is a diagram for showing an optical waveguide array, FIG. 13D is a cross-sectional diagram of an optical waveguide array longitudinally taken by a line XIIID XIIID shown in FIG. 13C, and FIG. 13E is a cross-sectional diagram of the optical waveguide array laterally taken along a line XIIIE-XIIIE shown in FIG. 13C.

FIG. 22 is a table for showing an example of factors in aspheric function relative to the collimator lens and the condenser lens.

FIG. 23A is a diagram for illustrating a diameter of the condenser lens and an incident region of parallel light before shifting the optical axis of the condenser lens and FIG. 23B is a diagram for illustrating a diameter of the condenser lens and an incident region of parallel light after shifting the optical axis of the condenser lens.

DETAILED DESCRIPTION

Figure 1:
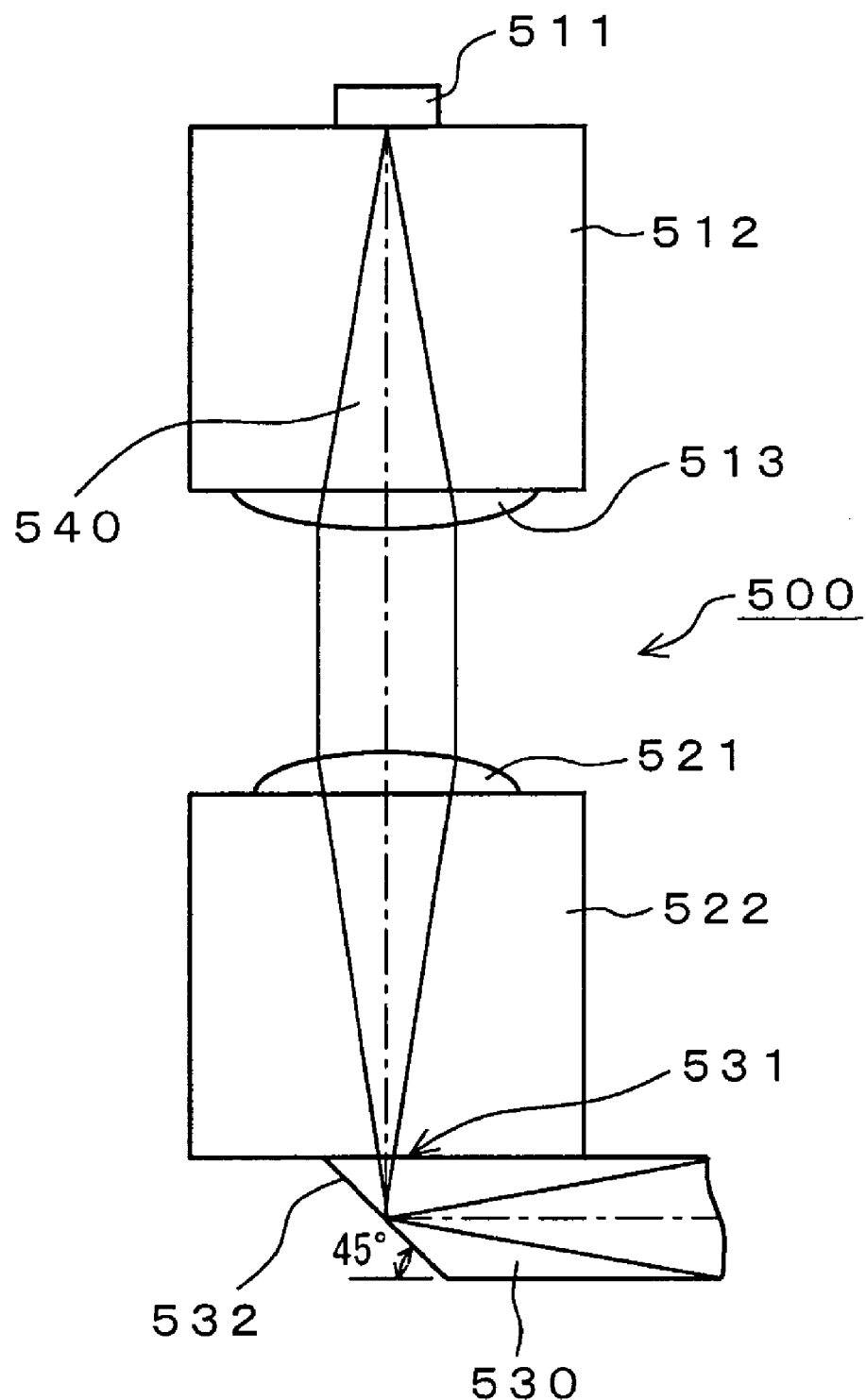
FIG. 1 is a diagram for illustrating a configuration of a lens assembly for transmitting an optical signal, as related one, which is a device for transmitting an optical signal that has a collimator lens and a condenser lens.
Figure 2:
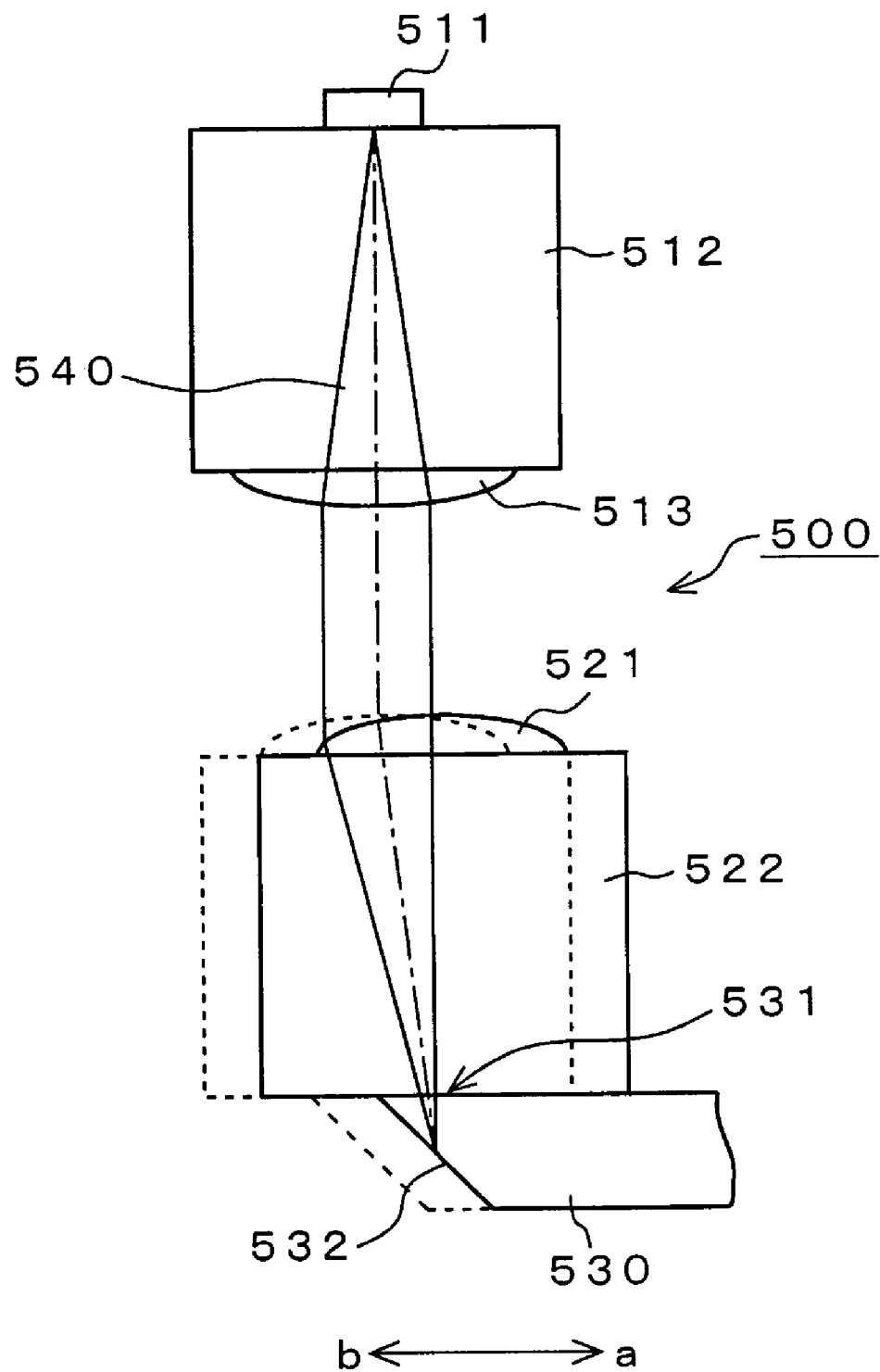
FIG. 2 is a diagram for illustrating a lens assembly for transmitting an optical signal, as related one, when any manufacture tolerance occurs.
Figure 3:
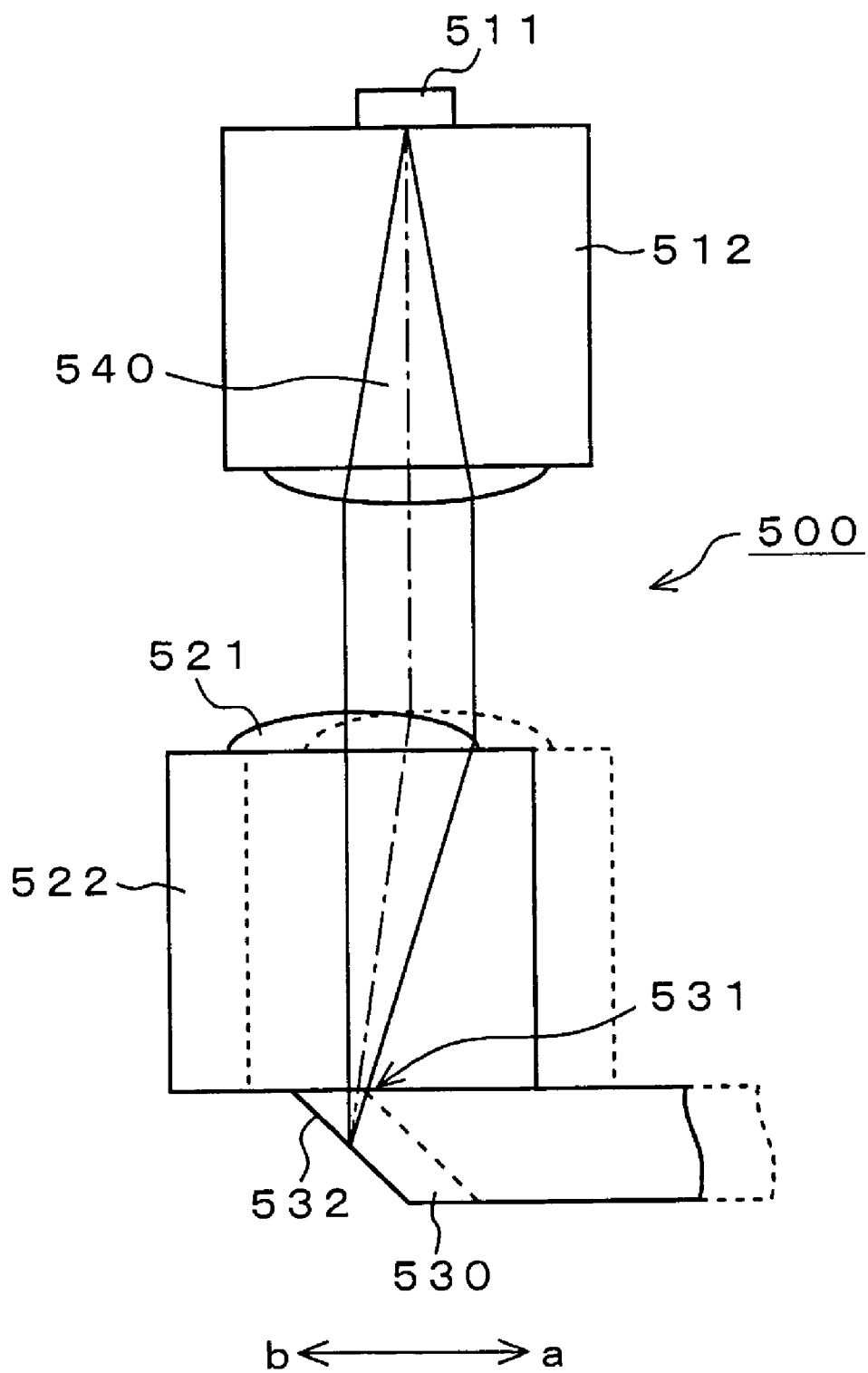
FIG. 3 is a diagram for explaining loss in an amount of light in the lens assembly for transmitting an optical signal, as related one, when any manufacture tolerance occurs.
Figure 4:
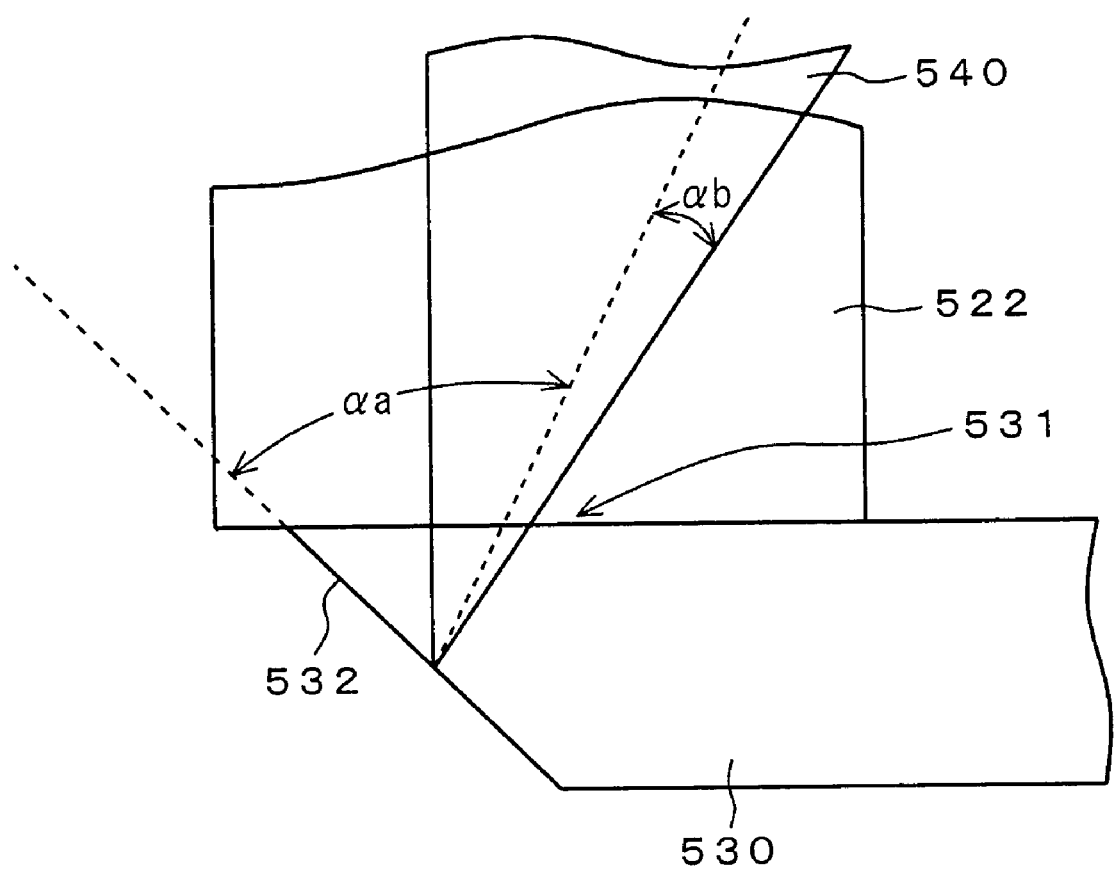
FIG. 4 is a schematic representation for explaining a perfect reflection region and a transparent region.
Figure 5:
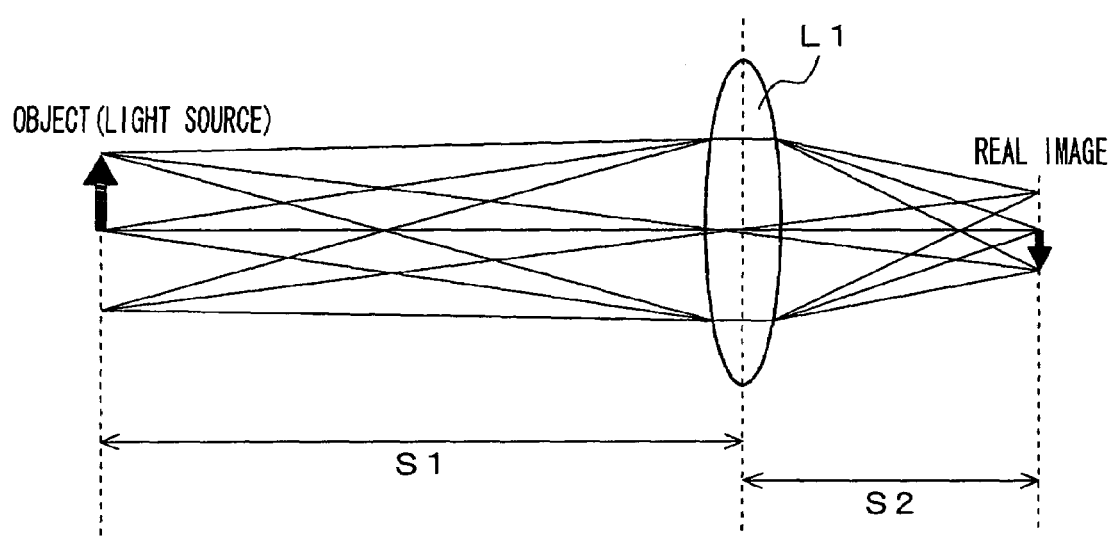
FIG. 5 is a diagram for illustrating a relationship between a focal distance and an imaging magnification.
Figures 7A, 7B:
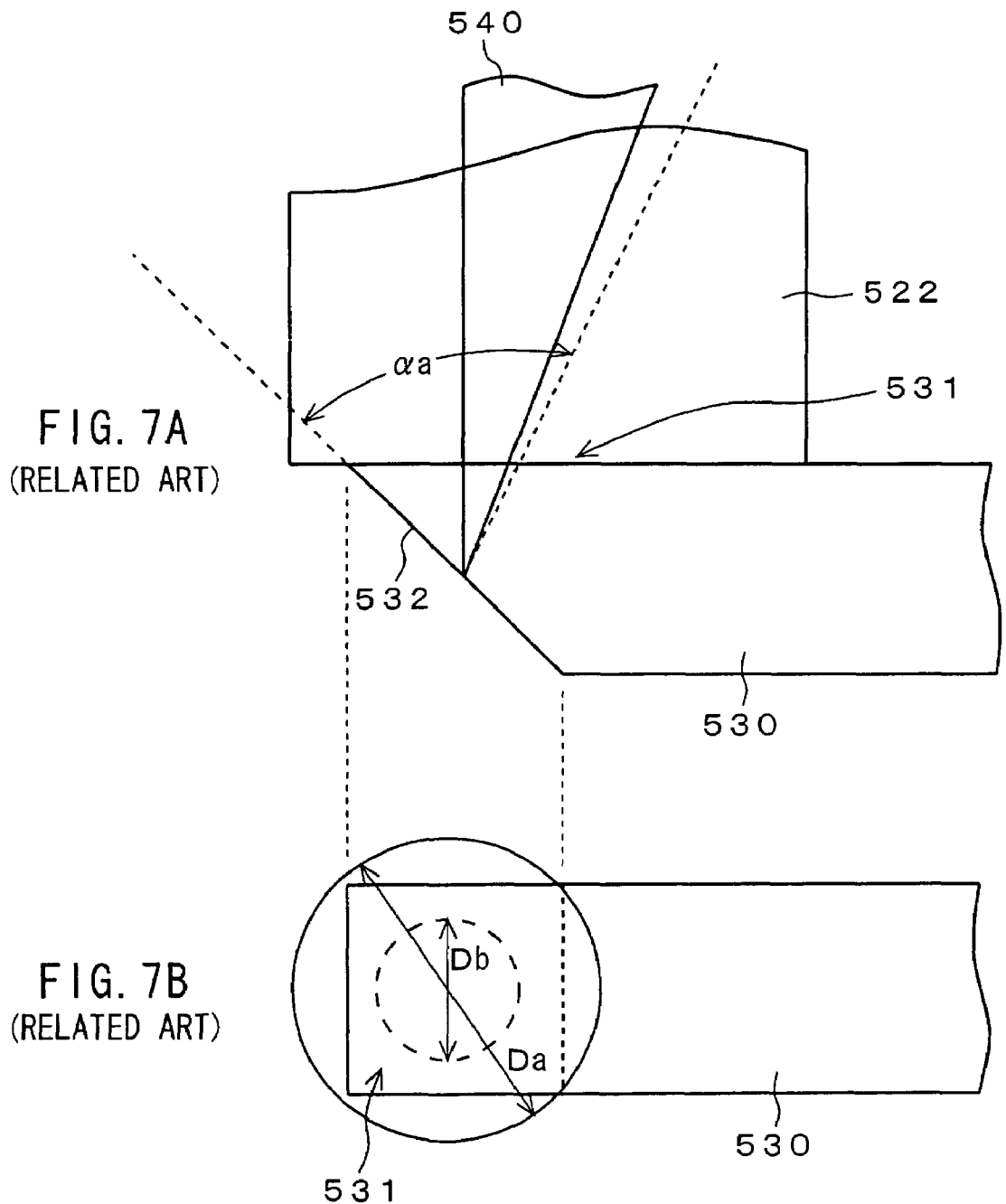
FIGS. 7A and 7B are diagrams for illustrating regions of the optical signal and focal diameters when NA of the condenser lens is decreased.
Figure 8:
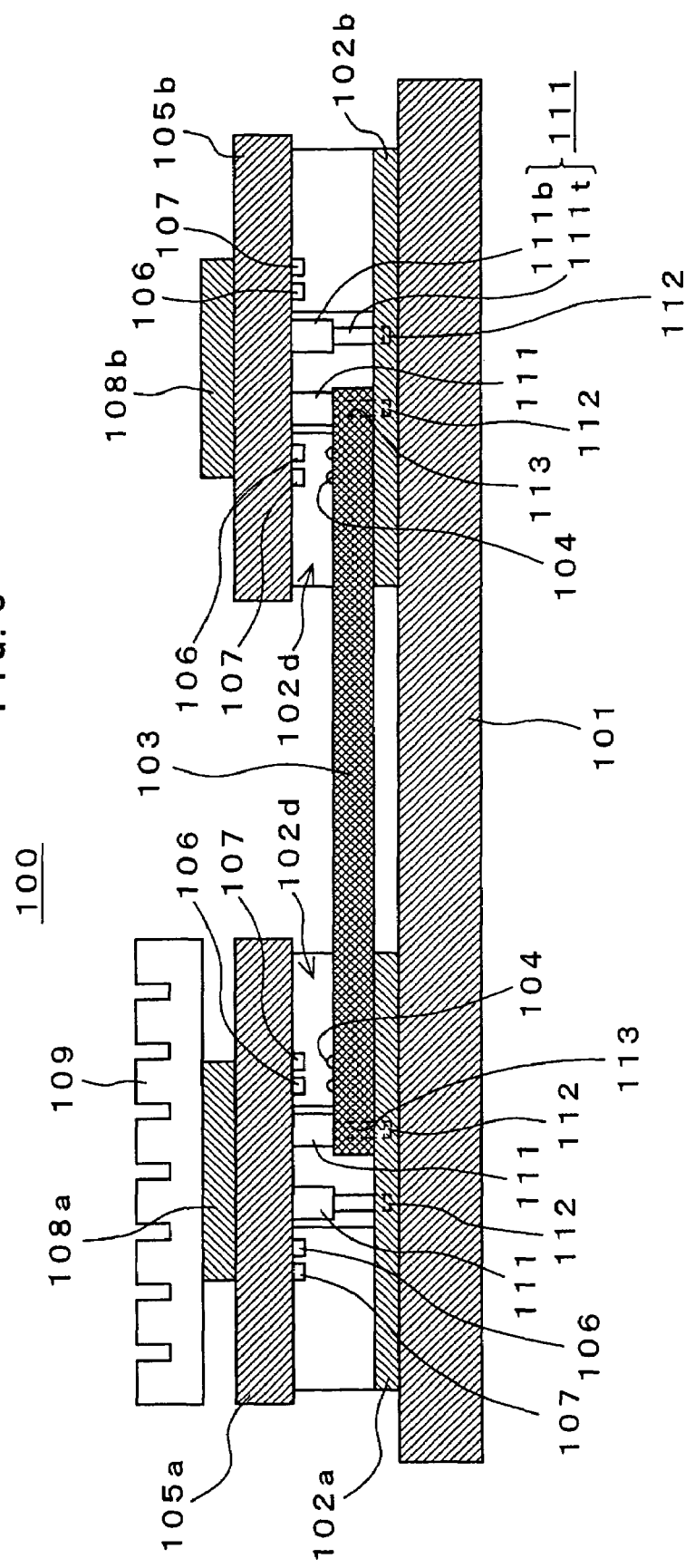
FIG. 8 is a schematically cross-sectional diagram for showing an embodiment of photoelectric composite apparatus according to the invention.

The following will describe embodiments of the invention with reference to the accompanying drawings. FIG. 8 schematically shows a cross-section of an embodiment of photoelectric composite apparatus 100 according to the invention.

The photoelectric composite apparatus 100 has IC sockets 102a, 102b that are installed on a printed-wiring board (a mother board) 101, and a lens-built-in optical waveguide array 103 that is placed on the IC sockets 102a, 102b. The IC sockets 102a, 102b respectively have a channel structure such as a cross-shaped channel 102d therein. The IC sockets 102a, 102b is made of, for example, insulating resin, i.e., polyethylene sulfide (PES) containing glass or polyethylene terephthalate (PET) resin containing glass, and the like, as well known, and is manufactured using a die having a corresponding channel structure.

The optical waveguide array 103 has optical waveguides of multiple channels, which will be described later. This optical waveguide array 103 is built across the IC sockets 102a and 102b. Opposite ends of the optical waveguide array 103 are respectively positioned in the channels 102d of the IC sockets 102a and 102b. This optical waveguide array 103 has a structure such that a core layer is sandwiched between upper and lower clad layers, which will be described later, and lenses 104 are built in the upper clad layer.

The photoelectric composite apparatus 100 has also interposers 105a, 105b that are respectively set on surfaces of the IC sockets 102a, 102b. A light-emitting element array 106 and a light-receiving element array 107 as optical elements are respectively installed on a back surface of the interposer 105a. A semiconductor chip 108a, for example, CPU is installed on a surface of the interposer 105a. The light-emitting element array 106 and the light-receiving element array 107 are connected to the semiconductor 108a though inside of the interposer 105a. It is to be noted that as a heat sink, a fin 109 made of aluminum is positioned on an upper surface of the semiconductor chip 108a.

Similarly, a light-emitting element array 106 and a light-receiving element array 107 as optical elements are respectively installed on a back surface of the interposer 105b. A semiconductor chip 108b is installed on the front surface of the interposer 105b. The light-emitting element array 106 and the light-receiving element array 107 are connected to the semiconductor 108b though inside of the interposer 105b.

The light-emitting element array 106 has a configuration such that plural light-emitting elements, for example, VCSEL elements can be arranged. The light-receiving element array 107 has a configuration such that plural light-receiving elements, for example, photodiodes can be arranged. The above optical waveguide array 103 is positioned so that the optical waveguides of respective channels face against each light-emitting element in the above light-emitting element array 106 and each lightreceiving element in the above light-receiving element array 107, respectively. The light-emitting element emits an optical signal that is incident to the optical waveguide. The lightreceiving element receives an optical signal exiting from the optical waveguide.

The following will describe the interposers 105a, 105b in the photoelectric composite apparatus 100 as well as a positioning mechanism of each of the interposers 105a, 105b and the optical waveguide 103.

Each of the interposers 105a, 105b has a positioning pin 111 standing downwardly from the back surface thereof. This positioning pin 111 is attached to the back surface of each of the interposers 105a, 105b by means of, for example, soldering it to metal pad, which is not shown, and set on the back surface of each of the interposers 105a, 105b. This positioning pin 111 has a forward end 111t having a first diameter that is capable for passing through a positioning through hole 113 cut through the optical waveguide array 103, which will be described later, and a bottom end 111b having a second diameter that is not capable for passing through the positioning through hole 113. The bottom end 111b is soldered to each of the interposers 105a, 105b.

Each of the IC sockets 102a, 102b has positioning hole 112 for allowing to be inserted the positioning pin 111 of each of the above interposers 105a, 105b at a bottom surface of the channel 102d thereof. A diameter of such the positioning hole 112 is set so as to make slightly smaller than the diameter of the forward end 111t of the positioning pin 111. For example, if the diameter of the forward end 111t of the positioning pin 111 is 2.1 mm ($\phi$=2.1 mm), the diameter of such the positioning hole 112 is set to 2.0 mm ($\phi$=2.0 mm). This causes the forward end 111t of the positioning pin 111 to be fitted into the positioning hole 112 by means of plastic deformation in each of the IC sockets 102a, 102b when the forward end 111t is inserted into the positioning hole 112, thereby preventing their looseness after the positioning thereof.

The optical waveguide 103 has on the opposed ends positioning through holes 113, 113 each for allowing to be passed through the positioning pins 111, 111 of the above interposers 105a, 105b. Similar to the diameter of the above positioning hole 112, a diameter of such the positioning through hole 113 is set so as to make slightly smaller than the diameter of the forward end 111t of the positioning pin 111. For example, if the diameter of the forward end 111t of the positioning pin 111 is 2.1 mm ($\phi$=2.1 mm), the diameter of such the positioning through hole 113 is set to 2.0 mm ($\phi$=2.0 mm). This causes the forward end 111t of the positioning pin 111 to be firmly inserted into the positioning through hole 113 by means of plastic deformation in the optical waveguide array 103 when the forward end 111t is inserted into the positioning through hole 113, thereby preventing their looseness after the positioning thereof.

The positioning of each of the interposers 105a, 105b and the optical waveguide array 103 is performed so that the positioning pins 111, 111 of the interposers 105a, 105b can pass through the positioning through holes 113, 113 of the optical waveguide array 103 to be inserted into the positioning holes 112, 112 of the IC sockets 102a, 102b.

In this case, a step formed between the bottom end 111b and the forward end 111t of each of the positioning pins 111 presses the optical waveguide array 103 against each of the surfaces of the IC sockets 102a, 102b. This prevents the optical waveguide array 103 from being raised from any of the surfaces of the IC sockets and also avoids loss in an amount of light by means of inclination of a light incident surface or a light-emitting surface of each of the optical waveguides.

It is to be noted that the interposers 105a, 105b are pushed downwardly toward IC socket side on their four corners, detail of which will be not described, and the interposers 105a, 105b are secured to the corresponding IC sockets 102a, 102b with the interposers 105a, 105b being respectively pushed against the IC sockets 102a, 102b.

FIG. 9 is a schematic perspective diagram for showing the above photoelectric composite apparatus 100. It is to be noted that in this FIG. 9, the printed-wiring board 101 and the fin 109 made of aluminum are omitted.

Figure 10A:
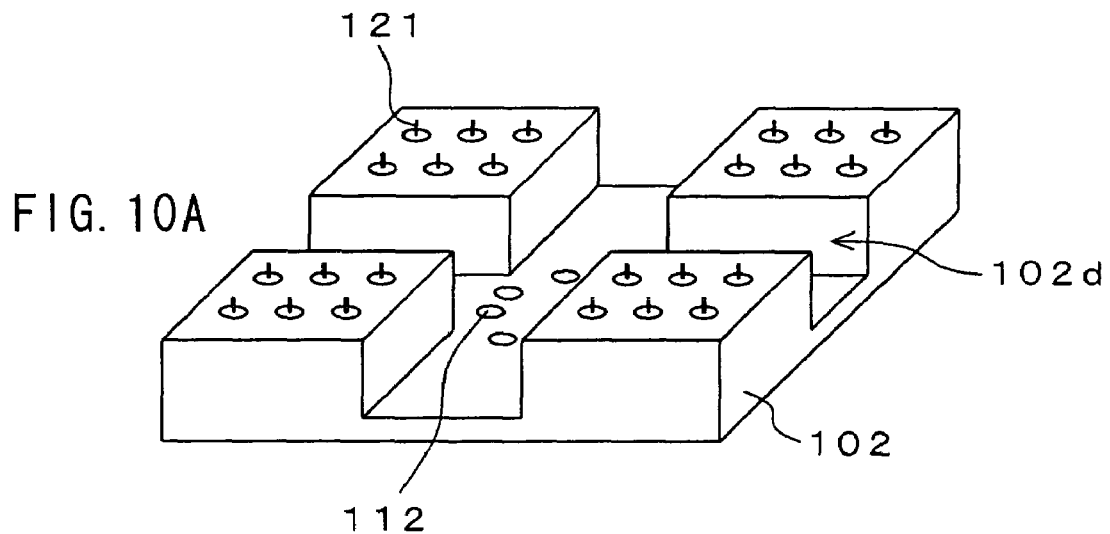
FIGS. 10A and 10B are schematic perspective diagrams each for showing a configuration of an IC socket.
Figure 10B:
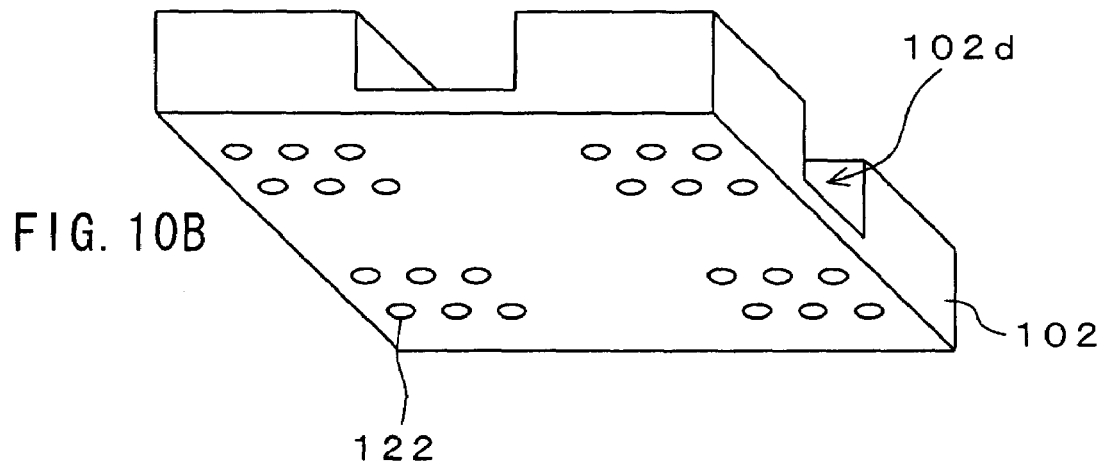

The following will describe more in detail each component constituting the above photoelectric composite apparatus 100. FIGS. 10A and 10B schematically show a configuration of an IC socket 102 (corresponding to respective IC sockets 102a, 102b); FIG. 10A is a schematic perspective diagram for showing a front surface of the IC socket 102 and FIG. 10B is a schematic perspective diagram for showing a back surface of the IC socket 102.

As shown in FIG. 10A, each of the IC sockets 102a, 102b has a channel structure such as a cross-shaped channel 102d on a front surface side thereof. A depth of the channel is deeper than a height of the optical waveguide array 103. When installing the optical waveguide array 103 into the IC sockets, there causes any space between the optical waveguide array 103 and the light-emitting element array 106 and the light-receiving element array 107.

On the front surface of the IC socket 102, a plurality of electrode pins 121 having a shape such as a rod shape, a plate spring shape, and a convolution shape is provided in order to connect them electrically to electrode pads 151 that are provided on a back surface of each of the interposers 105a, 105b (see FIG. 8) to be set on the front surface of the IC socket 102. It is to be noted that in FIG. 10A, rod shaped electrode pins 121 are shown.

On the back surface of the IC socket 102, as shown in FIG. 10B, a plurality of electrode contacts 122 such as solder bumps are provided in order to connect them electrically to electrodes on the printed-wiring board 101 (see FIG. 8). These electrode contacts 122 are respectively connected electrically to the corresponding electrode pins 121 provided on the front surface of the IC socket 102, through the IC socket 102.

On bottom surface of the channel 102d on the IC socket 102, as shown in FIG. 10A, there provide the positioning holes 112 for allowing to be inserted thereinto the positioning pins 111 provided on the back surface of each of the above interposers 105a, 105b. As described later, since eight positioning pins 111 are provided on the back surface of each of the interposers 105a, 105b, eight positioning holes 122 are provided. It is to be noted that in FIG. 10A, only four positioning holes 122 are shown.

In the IC socket 102, by utilizing the cross-shaped channel 102d, up to four optical waveguide arrays 103 may be provided along the four directions thereof (see FIG. 8). Thus, among the above eight positioning holes 112, two positioning holes 112 corresponding to every direction are used for allowing to be inserted thereinto the two positioning pins 111 corresponding to the optical waveguide array 103 provided along every direction.

Figure 11A:
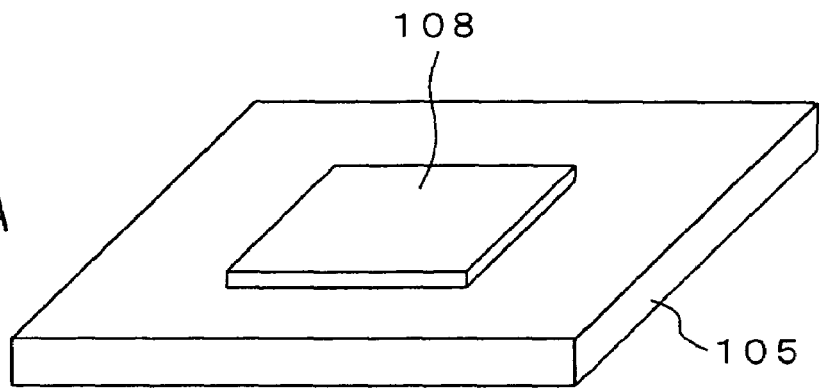
FIGS. 11A and 11B are schematic perspective diagrams each for showing a configuration of an interposer.
Figure 11B:
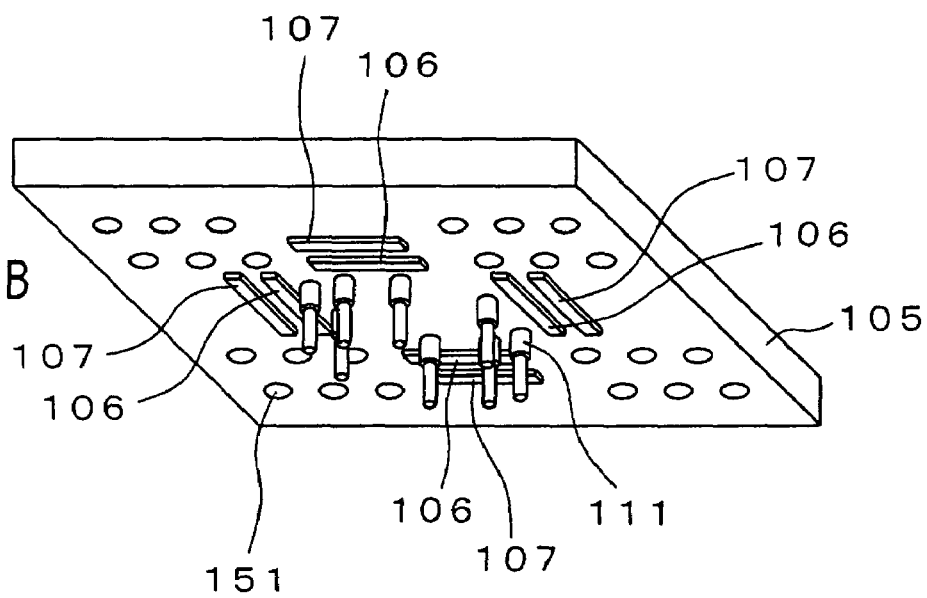

FIGS. 11A and 11B show a configuration of an interposer 105 (corresponding to each of the interposers 105a, 105b); FIG. 11A is a schematic perspective diagram for showing a front surface of the interposer 105 and FIG. 11B is a schematic perspective diagram for showing a back surface of the interposer 105.

A semiconductor chip 108 (corresponding to each of the semiconductor chips 108a, 108b) is installed on a front surface of each of the interposers, as shown in FIG. 11A. It is to be noted that a number of the semiconductor chips to be installed is not limited to one. On the back surface of the interposer 105, as shown in FIG. 11B, the light-emitting element array 106 and the light-receiving element array 107 are installed. Since up to four optical waveguide arrays 103 may be provided along the four directions thereof, as described above, four pairs of the light-emitting element array 106 and the light-receiving element array 107 are installed on the back surface of the interposer 105 corresponding to the optical waveguide arrays 103 provided along each of the directions thereof. Each of the light-emitting element array 106 and the light-receiving element array 107 is connected to the semiconductor chip 108 through the interposer 105.

On the back surface of the interposer 105, as shown in FIG. 11B, a plurality of electrode pads 151 are provided in order to connect them electrically to the electrode pins 121 provided on the front surface of the above IC socket 102 (see FIG. 10A).

From the back surface of the interposer 105, as shown in FIG. 11B, the metal electrode pins 111 stand downwardly. These positioning pins 111 are eight pins that correspond to the eight positioning holes 112 provided on the IC socket 102.

Figure 12A:
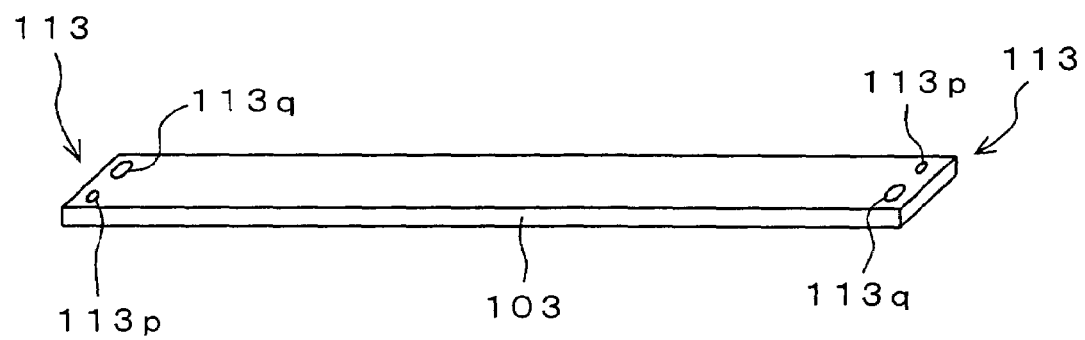
FIG. 12A is a schematic perspective diagram for showing a configuration of an optical waveguide array and FIG. 12B is a schematic plane diagram for showing the same.
Figure 12B:
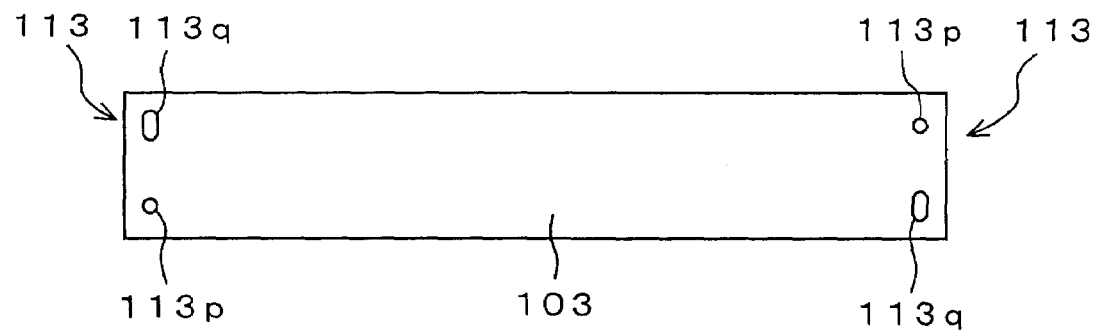

FIGS. 12A and 12B show a configuration of the optical waveguide array 103; FIG. 12A is a schematic perspective diagram for showing a front surface of the optical waveguide array 103 and FIG. 12B is a schematic plane diagram for showing a back surface of the optical waveguide array 103.

On the opposed ends of the optical waveguide array 103, the positioning through holes 113 for allowing to be inserted thereinto the positioning pins 111 (se FIG. 11B) of the above interposer 105 (each of the interposer 105a, 105b) are respectively provided. On each end, as the positioning through holes 113, a first hole 113p and a second hole 113q are cut spaced away from each other having a set of distance along a width direction thereof.

In this embodiment, the first hole 113p is cut round. For example, if a diameter of the forward end 111t of the positioning pin 111 is 2.1 mm, the diameter of the first hole 113p is set to 2.0 mm. The second hole 113q is cut in a slit like manner so that its major axis can be parallel with the width direction of the optical waveguide array 103. For example, if a diameter of the forward end 111t of the positioning pin 111 is 2.1 mm, a minor axis of the second hole 113q is set to 2.0 mm and a major axis thereof is set to 3.0 mm.

The first positioning pin 111 of the interposer 105 does not pass through the corresponding first hole 113p of the this optical waveguide array 103 but also the second positioning pin 111 of the interposer 105 passes through the corresponding second hole 113q of the this optical waveguide array 103, thereby preventing the optical waveguide array 103 from being rotated. The second hole 113q is formed in a slit like manner so that any positioning shift of the first and second positioning pins 111, 111 can be absorbed in a width direction of the optical waveguide array 103.

The following will describe configurations of the optical waveguide array 103, the light-emitting element array 106 and the light-receiving element array 107 more in detail with reference FIGS. 13A through 13E.

FIG. 13C shows a plane of the optical waveguide array 103. FIG. 13D is a cross-sectional diagram of the optical waveguide array 103 longitudinally taken by a line XIIID-XIIID shown in FIG. 13C. FIG. 13E is a cross-sectional diagram of the optical waveguide array 103 laterally taken along a line XIIIE-XIIIE shown in FIG. 13C. It is to be noted that in FIG. 13E, the overlapped lenses 104 are omitted in order to make the representation thereof clear. It is also to be noted that FIG. 13C shows only one side of the optical waveguide array 103 but the other side thereof is configured so as to have a same structure as that of the above one side.

The optical waveguide array 103 has a structure such that upper and lower clad layers 132, 133 basically sandwich a core layer 131. In this embodiment, a refractive index of the core layer 131 is set to higher one than those of the clad layers 132, 133, thereby causing an optical waveguide. For example, the core layer is made of ultraviolet (UV) cured optical resin, which has a refractive index of 1.6, and both of the clad layers 132, 133 are made of injection molded optical resin, which has a refractive index of 1.5.

In the core layer 131, optical waveguides of plural channels, namely, a plurality of optical waveguides 135 for transmission and a plurality of optical waveguides 136 for reception, are formed. It is to be noted that at the other side of the optical waveguide array 103, the optical waveguides 135 for transmission are functioned as the optical waveguides 136 for reception and the optical waveguides 135 for reception are also functioned as the optical waveguides 136 for transmission.

In this embodiment, the optical waveguides 135 for transmission and the optical waveguides 136 for reception are arranged one after the other along a width direction of the optical waveguide array 103. Ends of the plurality of optical waveguides 135 for transmission, which are arranged along the width direction of the optical waveguide array 103, are positioned away from one another in sequence in a longitudinal direction thereof. Similarly, ends of the plurality of optical waveguides 136 for reception, which are also arranged along the width direction of the optical waveguide array 103, are positioned away from one another in sequence in a longitudinal direction thereof. The ends of the optical waveguides 135 for transmission are arranged nearer to the end of the optical waveguide array 103 than those of optical waveguides 136 for reception are arranged.

End surface 135a of each of the optical waveguides 135 for transmission is formed as a mirror surface having an incline of 45 degrees. This allows an optical signal diffused from the light-emitting element in the light-emitting element array 106 to be reflected toward a longitudinal direction of the optical waveguide 135 by this end surface 135a, thereby achieving effective transmission of the corresponding optical signal. End surface 136a of each of the optical waveguides 136 for reception is also formed as a mirror surface having an incline of 45 degrees. This allows an optical signal transmitted through the optical waveguide 136 to be reflected toward a side of light-receiving element of the light-receiving element array 107 by this end surface 136a, thereby achieving effective reception of the corresponding optical signal.

Corresponding to the end surface 135a of each of the optical waveguides 135 for transmission and the end surface 136a of each of the optical waveguides 136 for reception, lenses 104 are built in the upper clad layer 132. In this embodiment, the lens 104 corresponding to the end surface 135a of each of the optical waveguides 135 for transmission functions as condenser lens for gathering the parallel light output from the light-emitting element of the light-emitting element array 106 to focus the parallel light into the end surface 135a. On the other hand, the lens 104 corresponding to the end surface 136a of each of the optical waveguides 136 for reception functions as collimator lens for converting the diffused light that is diffused out of the end surface 136a into the parallel light.

At the end of optical waveguide array 103, the upper clad layer 132 extends downwardly below the both side ends and forward side end thereof to form a wall 137 having a predetermined of height. Thus forming the wall 137 preferably avoids any damage or the like because the optical waveguides 135, 136 are kept floated from surfaces of the IC sockets 102a, 102b even if the optical waveguide array 103 is pressed against the surfaces of the IC sockets 102a, 102b.

It is to be noted that the first hole 113p and the second hole 113q are cut as the positioning through hole 113 in the upper clad layer 132.

FIG. 13A shows the light-emitting element array 106 and a lens array 141, which is not shown in FIG. 8, that is equipped with the light-emitting element array 106. The light-emitting element array 106 has a plurality of the light-emitting elements 161 corresponding to the end surfaces 135a of the plurality of optical waveguides 135 for transmission in the optical waveguide array 103. The light-emitting element 161 is, for example, VSCEL that emits laser light as the optical signal from a lower surface thereof. On the front surface of this light-emitting element array 106, electrode pads 162 that are respectively connected to the light-emitting elements 161 via metal wiring are provided. A plurality of lenses 142 respectively corresponding to the plurality of light-emitting elements 161 in the light-emitting element array 106 is formed on the lens array 141. These lenses 142 function as collimator lenses for converting the diffused light out of each of the light-emitting elements 161 into parallel light.

FIG. 13B shows the light-receiving element array 107 and a lens array 143, which is not shown in FIG. 8, that is equipped with the light-receiving element array 107. The light-receiving element array 107 has a plurality of the light-receiving elements 163 corresponding to the end surfaces 136a of the plurality of optical waveguides 136 for reception in the above optical waveguide array 103. The light-receiving element 163 is, for example, a photodiode that receives laser light as the optical signal from a lower surface thereof. On the front surface of this light-receiving element array 107, electrode pads 164 that are respectively connected to the light-receiving elements 163 via metal wiring are provided. A plurality of lenses 144 respectively corresponding to the plurality of light-receiving elements 163 in the light-receiving element array 107 is formed on the lens array 143. These lenses 144 function as condenser lenses for gathering the parallel light out of each of the optical waveguides 136 for reception in the optical waveguide 103 to focus the parallel light into a light incident surface of each of the light-receiving elements 163.

The following will describe an embodiment of a method for manufacturing the photoelectric composite apparatus 100 shown in FIG. 8.

First, the IC sockets 102a, 102b are installed onto the printed-wiring board 101. In this embodiment, they are installed so that the electrodes on the printed-wiring board 101 can be positioned to the electrode contacts 122 provided on the back surface of each of the IC sockets 102a, 102b to connect the electrodes on the printed-wiring board 101 with the IC sockets 102a, 102b, electrically. It is to be noted that other electronic parts has been previously installed and wired on the printed-wiring board 101.

Next, the optical waveguide array 103 is put on both of the IC socket 102a, 102b with the optical waveguide array 103 bridging between these IC sockets 102a, 102b. In this condition, the opposed ends of the optical waveguide array 103 are respectively put in the channels 102d, 102d of the IC sockets 102a, 102b. It is preferable that the optical waveguide array 103 put on the IC sockets 102a, 102b may have a length longer than a distance between the IC sockets 102a, 102b. This allows the optical waveguide array 103 to be secured with it having a flexible condition, thereby moderating any positioning error of each of the IC sockets 102a, 102b against the printed-wiring board 101.

The interposer 105a is secured to the front surface of the IC socket 102a. The forward end 111t of each of the eight positioning pins 111 provided on the back surface of the interposer 105a is inserted into the positioning hole 112 provided on the bottom surface of the channel 102d in the IC socket 102a, so that the interposer 105a can be positioned. In this case, two positioning pins 111 corresponding to the optical waveguide array 103 pass through the positioning through holes 113 (the first hole 113p and the second hole 113q), respectively, in the corresponding optical waveguide array 103 and then, are inserted into the positioning holes 112. This allows the optical waveguide array 103 to be positioned simultaneously.

When the interposer 105a is secured to the front surface of the IC socket 102a, the interposer 105a, for example, on four corners thereof, is biased towards the IC socket 102a to press the interposer 105a against the IC socket 102a.

Next, the aluminum fin 109 is equipped on the upper surface of the semiconductor chip 108a installed of the front surface of the interposer 105a. This allows any heat generated from the semiconductor chip 108a to be effectively radiated through the fin 109.

The interposer 105b is then secured to the front surface of the IC socket 102b. The forward end 111t of each of the eight positioning pins 111 provided on the back surface of the interposer 105b is inserted into the positioning hole 112 provided on the bottom surface of the channel 102d in the IC socket 102b, so that the interposer 105b can be positioned. In this case, two positioning pins 111 corresponding to the optical waveguide array 103 pass through the positioning through holes 113 (the first hole 113p and the second hole 113q), respectively, in the corresponding optical waveguide array 103 and then, are inserted into the positioning holes 112. This allows the optical waveguide array 103 to be positioned simultaneously.

When the interposer 105b is secured to the front surface of the IC socket 102b, the interposer 105b, for example, on four corners thereof, is biased towards the IC socket 102b to press the interposer 105b against the IC socket 102b.

Figure 14:
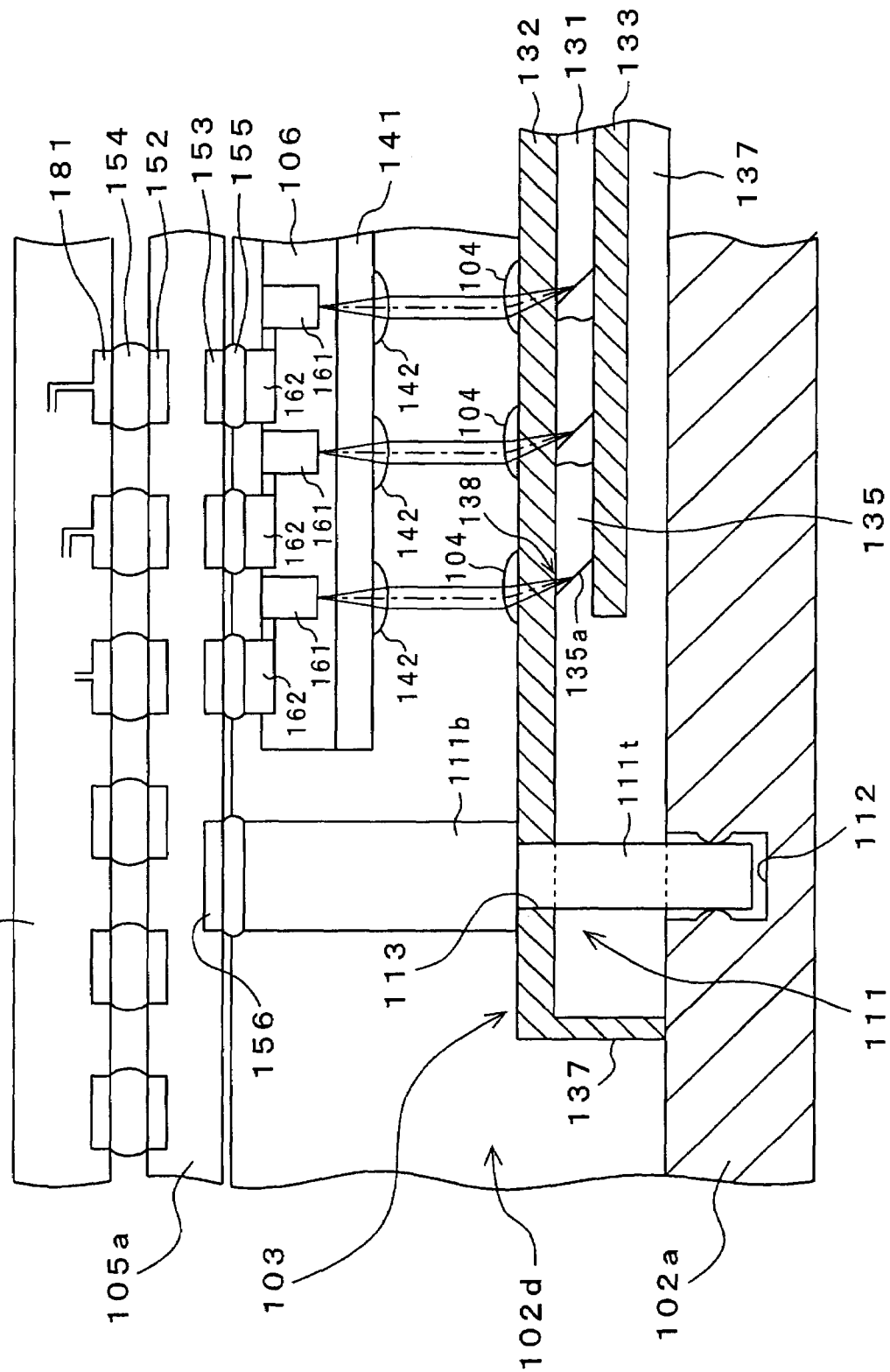
FIG. 14 is a diagram for illustrating a positioning mechanism on the interposer and the optical waveguide array.

FIG. 14 illustrates a positioning mechanism on the interposer 105a and the optical waveguide array 103 at a side of IC socket 102a in an enlarged method. In FIG. 14, like reference numbers are attached to like components shown in FIGS. 8 and 13A through 13E.

The interposer 105a installs the semiconductor chip 108a on its front surface. In this time, the semiconductor chip 108a is soldered to the front surface of the interposer 105a with the electrode pads 152 on the front surface of the interposer 105a being connected to the electrode pads 181 on the back surface of the semiconductor chip 108a through the solder bumps 154.

The interposer 105a also installs the light-emitting element array 106 on its back surface. In this time, the light-emitting element array 106 is soldered to the back surface of the interposer 105a with the electrode pads 153 on the back surface of the interposer 105a being connected to the electrode pads 162 on the upper surface of the light-emitting element array 106 through the solder bumps 155. The lens array 141 is equipped with the lower surface of the light-emitting element array 106.

The end of the optical waveguide array 103 is then put in 15 the channel 102d of the IC socket 102a. The positioning pin 111 is soldered to the metal pad 156 provided on the back surface of the interposer 105a to stand downwards from the back surface of the interposer 105a. The forward end 11 It of the positioning pin 111 passes through the positioning through hole 113 of the optical waveguide array 103 so that it can be inserted (or pressed) into the positioning hole 112 of the IC socket 102a. This allows both of the interposer 105a and the optical waveguide array 103 to be positioned simultaneously.

The optical signal diffused from the light-emitting element 161 of the light-emitting element-array 106 is converted from its diffused light into parallel light by means of each lens (collimator lens) in the lens array 141 equipped with the light-emitting element array 106. The parallel light is then gathered and focused into an opening 138 of the optical waveguide, which is provided in an end of the optical waveguide 135 for transmission, by each lens (condenser lens) built in the upper clad layer 132 of the optical waveguide array 103. The optical signal focused into the optical waveguide 135 through the opening 138 of the optical waveguide is incident to the end surface 135a (mirror surface) of this optical waveguide 135 which reflects the optical signal towards a longitudinal direction of the optical waveguide 135.

In this case, an optical axis of the lens (condenser lens) 104 is shifted toward the other end of the optical waveguide 135 by a predetermined distance with respect to an optical axis of the lens (collimator lens) 142, thereby shifting a main bean position of the parallel light output from the lens 142 away from the optical axis position of the lens 104 toward the end of the optical waveguide 135 by a predetermined distance. This satisfies conditions of perfect reflections for the optical signal that is incident to the mirror surface without decreasing NA of the lens 104. It is to be noted that how to set a shift amount thereof will be described later.

Although FIG. 14 has illustrated the positioning mechanism on the interposer 105a and the optical waveguide array 103 at the side of the IC socket 102a, a positioning mechanism on the interposer 105b and the optical waveguide array 103 at a side of IC socket 102b has similar configuration, a detailed explanation of which will be omitted.

The following will describe operations of the above photoelectric composite apparatus 100 (see FIGS. 8, 13A through 13E, and 14 ).

In the side of IC socket 102a of the photoelectric composite apparatus 100, an electric signal from the semiconductor chip 108a passes through the interposer 105a to be supplied to the light-emitting element (for example, VCSEL) 161 of the light-emitting element array 106 that is equipped with the back surface of the interposer 105a. The light-emitting element 161 then emits optical signal on which optical strength modulation is performed corresponding to the electric signal.

The collimator lens 142 of the lens array 141 that is equipped with the light-emitting element array 106 converts the optical signal from the light-emitting element 161 from its diffused light into parallel light. The lens 104 built in the upper clad layer 132 of the optical waveguide array 103 then gathers this parallel light to focus it into the opening 138 of the optical waveguide, which is provided on an end of the optical waveguide 135 for transmission. The optical signal focused into the optical waveguide 135 from the opening 138 is incident to the end surface (the mirror surface having 45 degrees) 135a. The end surface 135a reflects the optical signal toward the longitudinal direction of the optical waveguide 135. This allows the optical signal emitted from the light-emitting element 161 of the light-emitting element array 106 at the side of IC socket 102a of the photoelectric composite apparatus 100 to be transmitted to the side of IC socket 102b of the photoelectric composite apparatus 100 through the optical waveguide 135 for transmission.

At the side of IC socket 102b of the photoelectric composite apparatus 100, the optical signal received through the optical waveguide 136 for reception (the optical waveguide 135 for transmission in the side of IC socket 102a) is reflected by the end surface (mirror surface having 45 degrees) 136 a toward the light-receiving element 136 of the light-receiving element array 107. The lens 104 built in the upper clad layer 132 of the optical waveguide array 103 converts this reflected optical signal from its diffused light into parallel light. The lens 144 of the lens array 143 that is equipped with the light-receiving element array 107 then gathers this parallel light to make it incident to the light incident surface of the light-receiving element 163, for example, a photodiode.

The light-receiving element 163 then converts the optical signal into the electric signal. This electric signal passes through the interposer 105b to be supplied to the semiconductor chip 108b installed on the front surface of the interposer 105b. This allows the electric signal output from the semiconductor chip 108a installed on the interposer 105a at the side of IC socket 102a of the photoelectric composite apparatus 100 to be supplied to the semiconductor chip 108b installed on the interposer 105b at the side of IC socket 102b of the photoelectric composite apparatus 100.

It is to be noted that the electric signal can be similarly supplied from the semiconductor 108b at the side of IC socket 102b of the photoelectric composite apparatus 100 to the semiconductor 108a at the side of IC socket 102a of the photoelectric composite apparatus 100, detailed explanation of which will be omitted.

Figure 15:
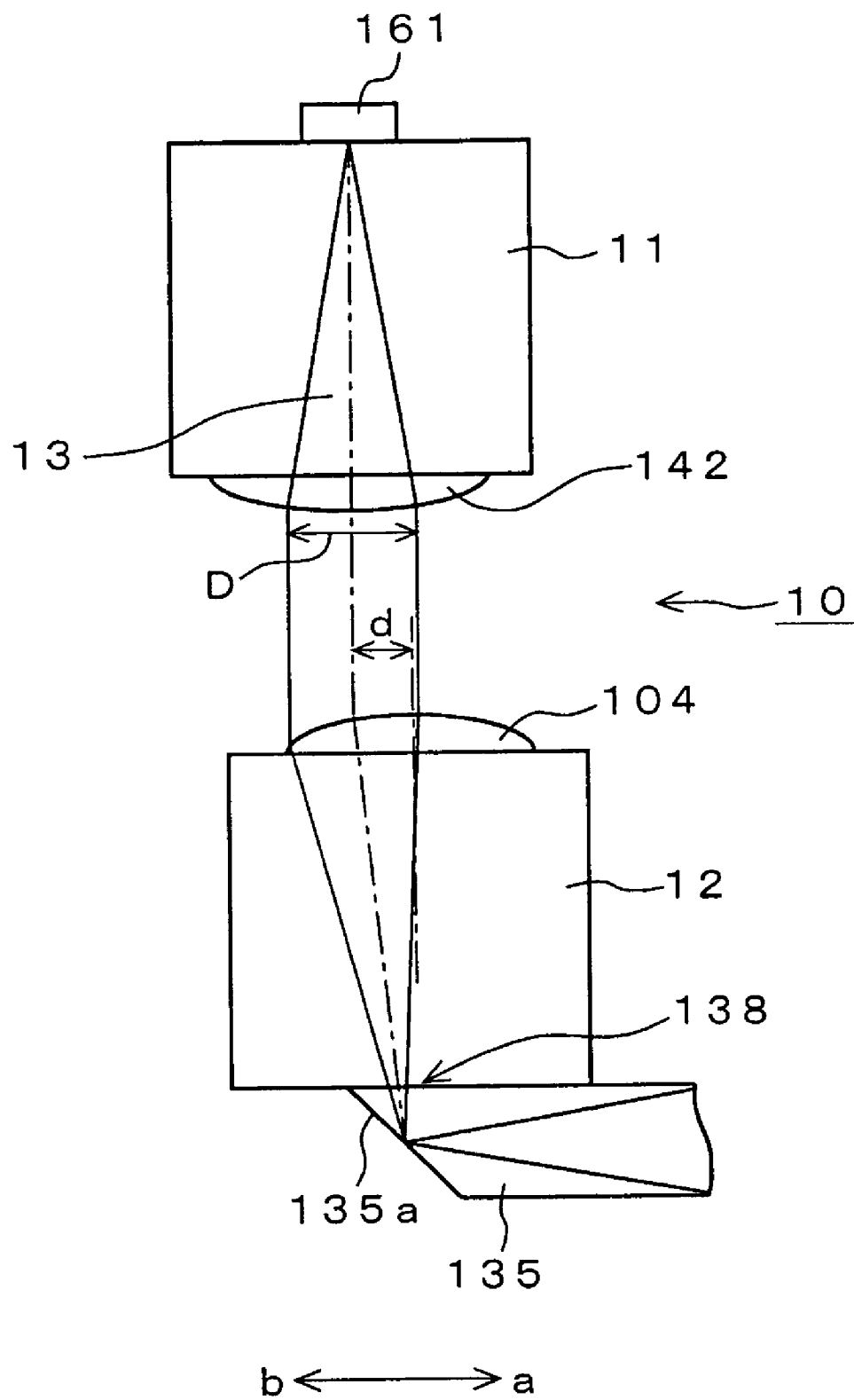
FIG. 15 is a diagram for illustrating a configuration of an embodiment of a lens assembly for transmitting an optical signal according to the invention, which is a device for transmitting an optical signal that has a collimator lens and a condenser lens.

The following will describe a device 10 for transmitting an optical signal, which is a lens assembly, including the light-emitting element 161, the lens 142 (hereinafter, referred to as "the collimator lens 142"), and the lens 104 (hereinafter, referred to as, "the condenser lens 104"). FIG. 15 illustrates a configuration of the device 10 for transmitting an optical signal. In FIG. 15, like reference numbers are attached to like components shown in FIG. 14, the detailed explanation of which will be appropriately omitted.

The device 10 for transmitting an optical signal has a light-emitting element 161 that is constituted of, for example, VCSEL outputting an optical signal, lens base 11 of a light-emitting element side, the collimator lens 142 for converting the optical signal diffused out of the light-emitting element 161 from its diffused light into parallel light, the condenser lens 104 for gathering the parallel light output from the collimator lens 142 to focus the parallel light into an opening 138 of an optical waveguide, which is provided on an end of the optical waveguide 135 for transmission, and lens base 12 of waveguide side.

To the lens base 11 of a light-emitting element side, a portion of a substrate of the lens array 141, a protection layer covering a front surface of the light-emitting element 161 of the light-emitting element array 106 and the like correspond. To the lens base 12 of waveguide side, the upper clad layer 132 of the optical waveguide array 103 that is equipped with the condenser lens 104 corresponds.

The optical signal (laser light) 13 output from the light-emitting element 16 is incident into the collimator lens 142 through the lens base 11, by which it is converted from its diffused light into the parallel light. The parallel light is also incident into the condenser lens 104 by which the parallel light is focused into the opening 138 of the optical waveguide 135 for transmission, which is provided on an end ("b" side shown in FIG. 15) of the optical waveguide 135, through the lens base 122. An end surface 135*a* (hereinafter, referred to as "mirror surface 135*a*") having an inclined angle of 45 degrees then reflects the optical signal that has been focused into the opening 138. The waveguide 135 then guides the reflected optical signal along it.

An optical axis of the condenser lens 104 is shifted toward the other end ("a" side shown in FIG. 15) of the waveguide 135 by a predetermined distance, "d" shown in FIG. 15, with respect to an optical axis of the collimator lens 142 so that the parallel light output from the collimator lens 142 can be moved away by the distance, "d" from an optical axis position of the condenser lens 104 toward the end ("b" side) of the optical waveguide 135. This allows conditions of perfect reflections for the optical signal that is incident to the mirror surface 135*a* to be satisfied without decreasing NA of the imaging lens 104. Thus, in this embodiment, NA of the imaging lens 104 does not decrease but the focal diameter increases at the opening 138 of the waveguide 135, thereby prevent an amount of light rejected by the opening 138 from being augmented.

The following will describe how to design the device 10 for transmitting the optical signal as the lens assembly.

First, it will describe how to design the lens assembly at the light-emitting element side. Based on an emission angle of the optical signal 13 emitted from the light-emitting element 161 and a collimated width thereof, thickness of the lens base 11 is determined. The collimator lens 142 is designed so that the optical signal propagated in this lens base 11 can be collimated.

Figure 16:
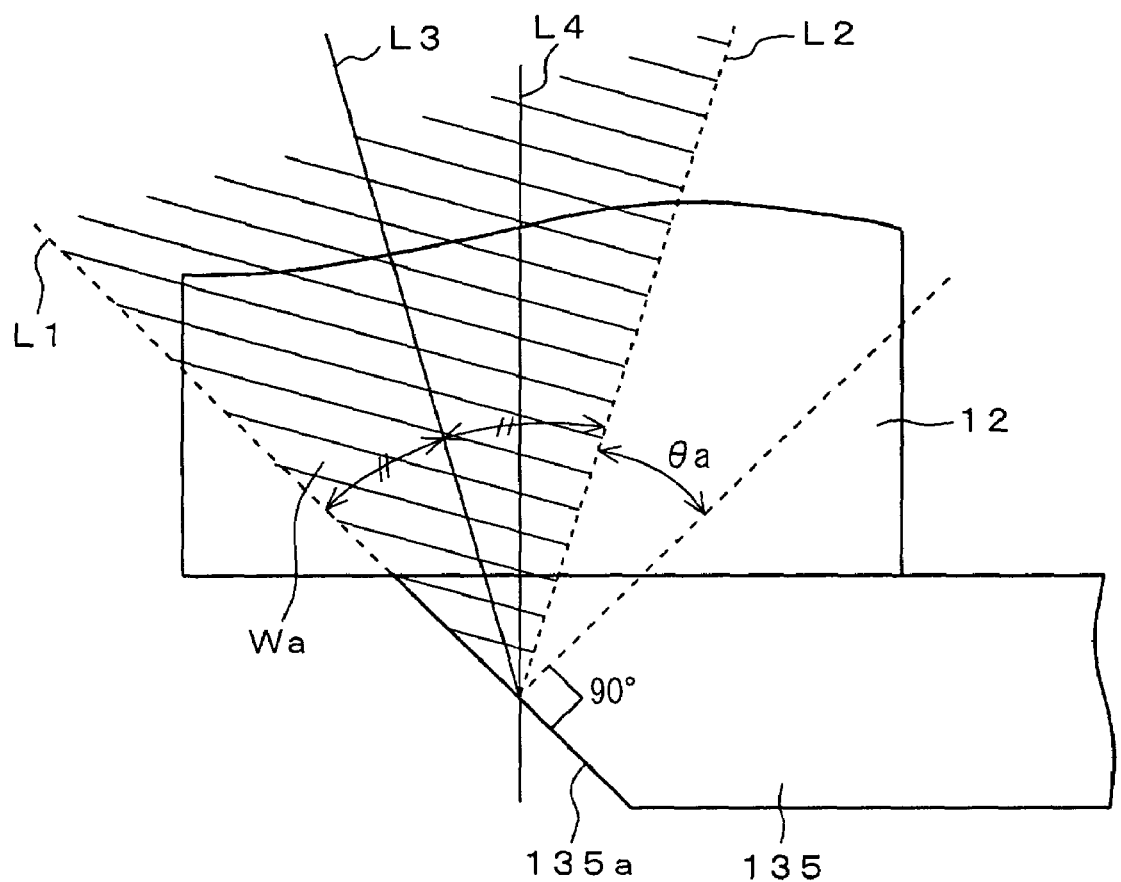
FIG. 16 is a diagram for illustrating how to get an ideal position of a main beam of the optical signal.

Next, using FIG. 16, it will describe how to design the lens assembly at the optical waveguide side. Based on material of the optical waveguide 135 and environment thereof, a critical angle θa that is critical limit angle for perfect reflection in the mirror surface 135*a* of the optical waveguide 135 is calculated. A region Wa covering between a line L1 extending along the mirror surface 135*a* of the optical waveguide 135 and a line L2 indicating to the critical angle θa constitutes a perfect reflection region. A line L3 halving the region Wa, namely, a line halving an angle covering from the line L1 to the line L2 is obtained. This line L3 is set as an ideal location of the main beam of the optical signal 13. If the main beam of the optical signal 13 is overlapped on the line L3, it is possible to make NA of the incident light to the optical waveguide 135 largest. It is to be noted that a line 4 shown in FIG. 16 indicates an optical axis of the condenser lens 104 (see FIG. 15).

Figure 17:
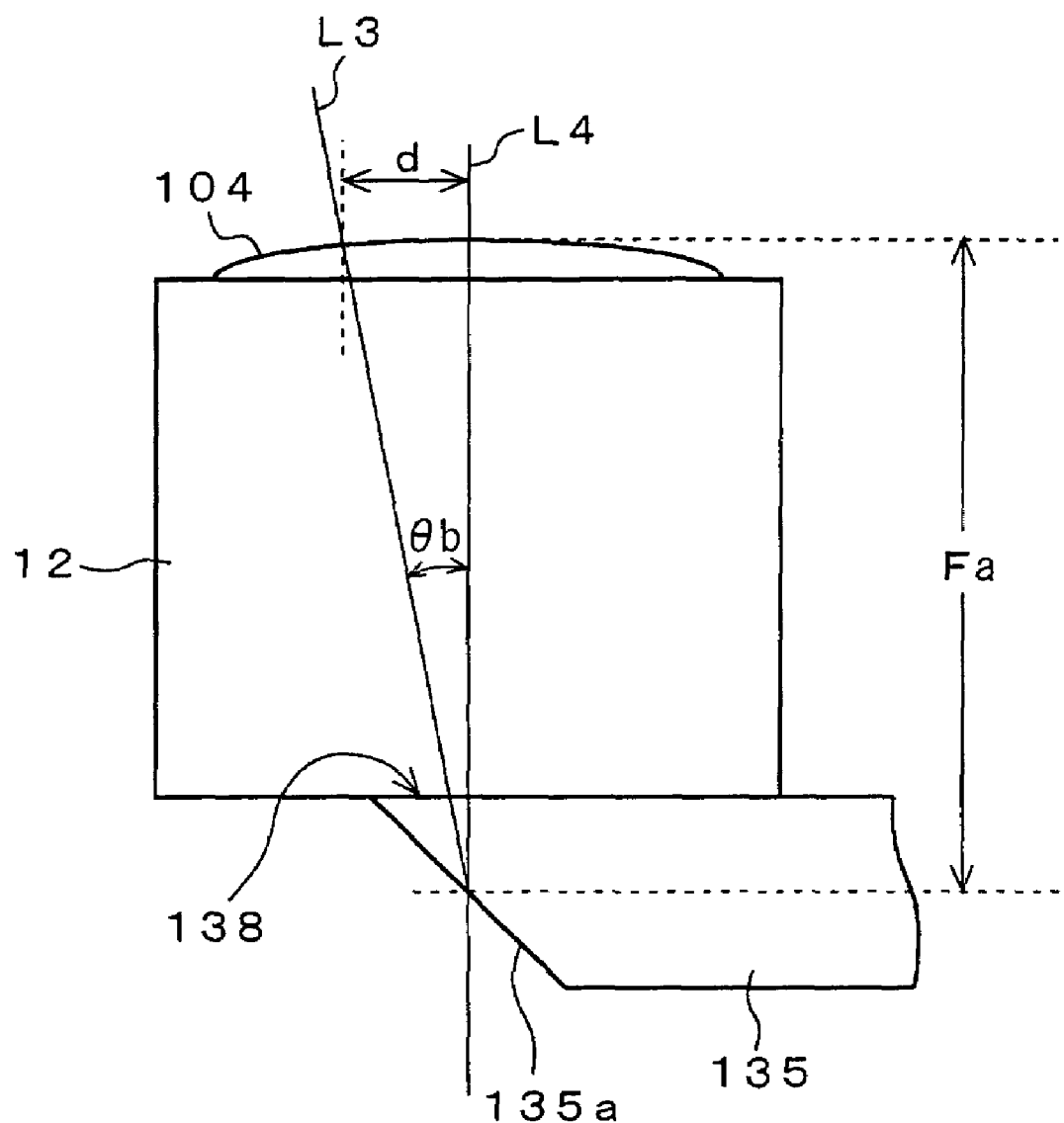
FIG. 17 is a diagram for illustrating how to get a shift amount of an optical axis of the condenser lens.

The amount of shift, i.e., a distance, "d" of the line L4, namely, the optical axis of the condenser lens 104 with respect to the optical axis of the collimator lens 142 is obtained. Since an ideal location of the main beam of the optical signal 13 is the line L3, an inclined angle θb of the optical signal 13 with respect to the optical axis of the condenser lens 104 is understood, as shown in FIG. 17. From the inclined angle θb and the focal distance Fa of the condenser lens 104, the distance "d" is given as an amount of shift by the following equation (1):

$$d = Fa * \tan \theta b \qquad (1)$$

Since an amount of shift (a distance, "d") of the lens assembly at the light-emitting element side with respect to the lens assembly at the waveguide side is given as above, the condenser lens 104 is designed so that the optical signal can be focused into the opening 138 of the wave guide with the amounts of shift being kept.

Next, it will describe more in detail how to design the device 10 for transmitting the optical signal. In a specific example, a design specification therefore is as follows: a size of light source in the light-emitting element 161 is 30 μmψ; an emission angle (total angular) of the light source in the light-emitting element 161 is 20 degrees; refraction index of each of the collimator lens 142, the condenser lens 104 and the optical waveguide 135 is 1.5; refraction index of each of the lens bases 11, 12 is 1.4; the collimated width that is a width of the parallel light is 170 μm or less; and the opening 138 of the waveguide is 30 μm square.

The lens assembly is first designed according to the past design method and the condenser lens 104 is then redesigned with the optical axis of the condenser lens 104 being shifted.

The following will describe the past design method of lens assembly. The collimated width D that is a width of the parallel light (see FIG. 15) is determined. Such the collimated width D is determined based on limitation and/or specification on the manufacture such as concentration of the collimator lenses 142 and the condenser lenses 104 in the lens array according to the concentration of optical waveguides 135, any limitation on the manufacture of lens SAG and lens size, and the lowest thickness of the lens bases 11, 12 that is flexible applicable to their assembly. Based on this collimated width D and the emission angle of the light source in the light-emitting element 161, the thickness of lens base 11 at the light emitting element side is determined. The collimator lens 142 is designed so that the optical signal that propagates in the lens base 11 can be converted form its diffused light into parallel light.

Figure 18:
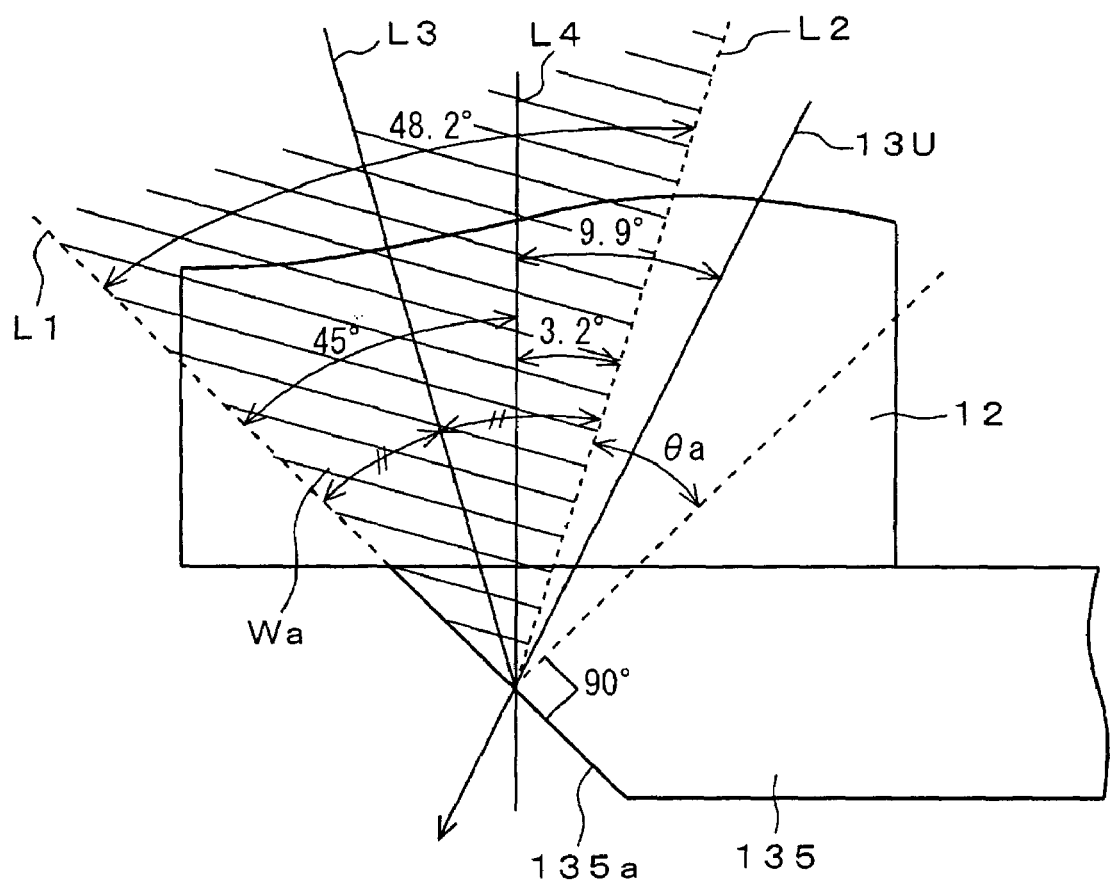
FIG. 18 is a diagram for illustrating how to design an embodiment of a lens assembly according to the invention.

The condenser lens 104 is designed so that the parallel light can be gathered and focused into a size corresponding to the opening 138 of the optical waveguide 135. Based on difference between refraction index of plastic material and that of air, the critical angle θa satisfying the perfect reflection at the mirror surface 135a of the optical waveguide 135 is inclined by about 3.2 degrees with respect to the optical axis of the condenser lens 104, as shown in FIG. 18. Since both of the sizes of light source in the light-emitting element 161 and the opening 138 of the optical waveguide 135 are 30 μm, the lens assembly is configured in same size. In the other words, the collimator lens 142 and the condenser lens 104 have a focal distance similar to each other in their lens assembly.

Figure 19:
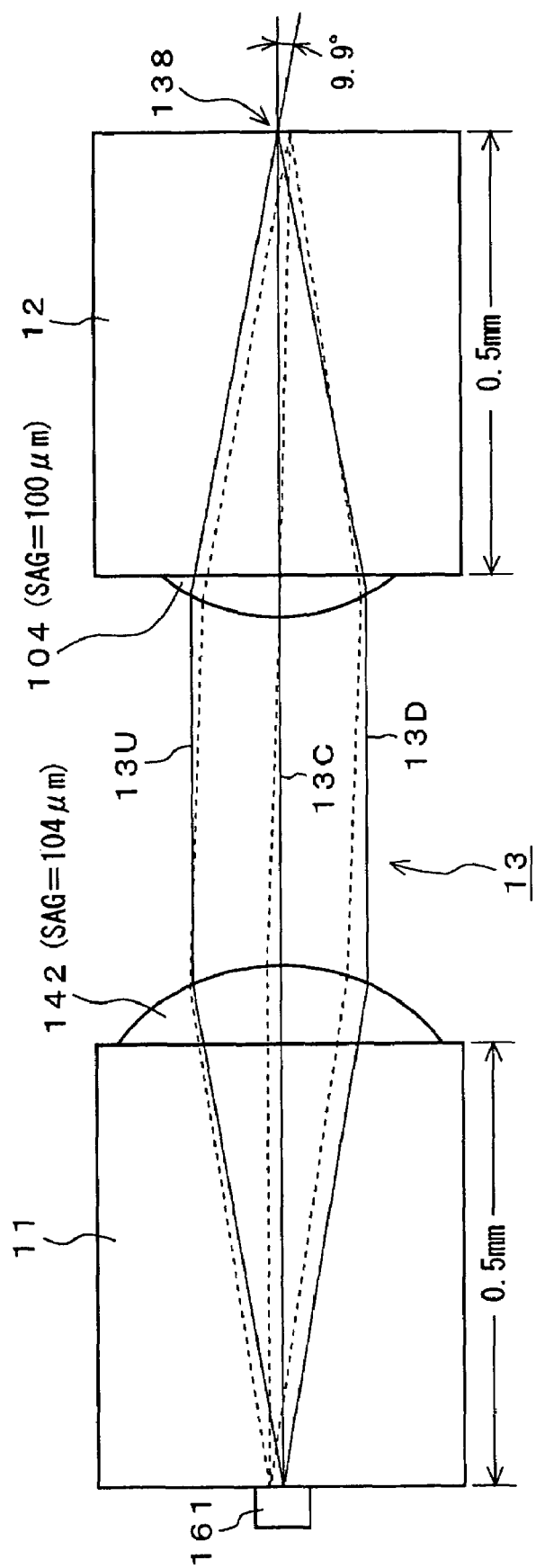
FIG. 19 is a diagram for illustrating an example of the lens assembly designed according to a related art.

FIG. 19 illustrates a lens assembly that is designed using the past method. In this FIG. 19, solid lines indicate main beam 13C, upper beam 13U, and lower beam 13D that are emitted from a center of light source in the light-emitting element 161 as well as dotted lines indicate those that are emitted from an upper end of light source in the light-emitting element 161. In this case, a focal diameter is about 30 μm at the opening 138 of the optical waveguide 135 and an incident angle of the upper beam 13U is about 9.9 degrees, thus causing the beams to pass through the mirror surface 135a (see FIG. 18).

Next, it will describe how to redesign the condenser lens 104. Since a focal distance of the condenser lens 104 is about 500 μm and a perfect reflection region of this lens assembly covers about 48.2 degrees (=45 degrees +3.2 degrees: see FIG. 18), the main beam 13C of the optical signal 13 is put on the ideal main beam position when the amount of shift (distance d) of the optical axis of the condenser lens 104 is about 200 μm. If a lens is designed so that the main beam 13C can be put on the ideal main beam position, the lens assembly shown in FIG. 20 can be obtained.

Figure 20:
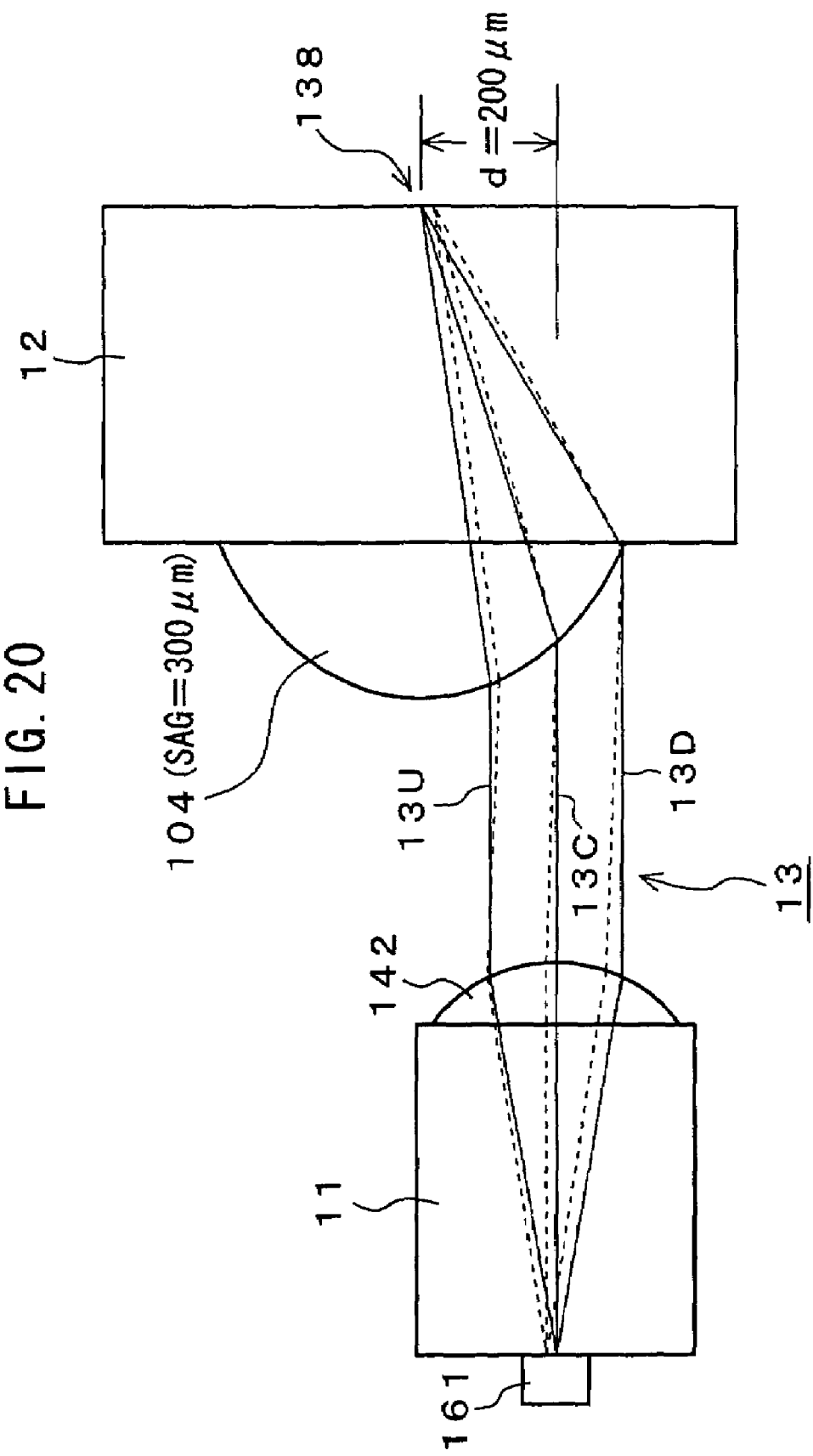
FIG. 20 is a diagram for illustrating an example of lens assembly in which the condenser lens is redesigned according to the invention.

As seen from FIG. 20, however, if a condenser lens is designed so that the main beam 13C can pass through the ideal beam position, a projection height SAG of the condenser lens is too large, so that it may be difficult to manufacture such the condenser lens 104.

Thus, it is preferable to recognize that an amount of shift where the main beam 13C passes through the ideal beam position is maximum one. In other words, the amount of shift (the distance d) is set so that an inclination of the main beam 13C with respect to the optical axis of the condenser lens 104 cannot become larger than the inclination of the above halving line L3 with respect to the optical axis of the condenser lens 104.

Figure 21:
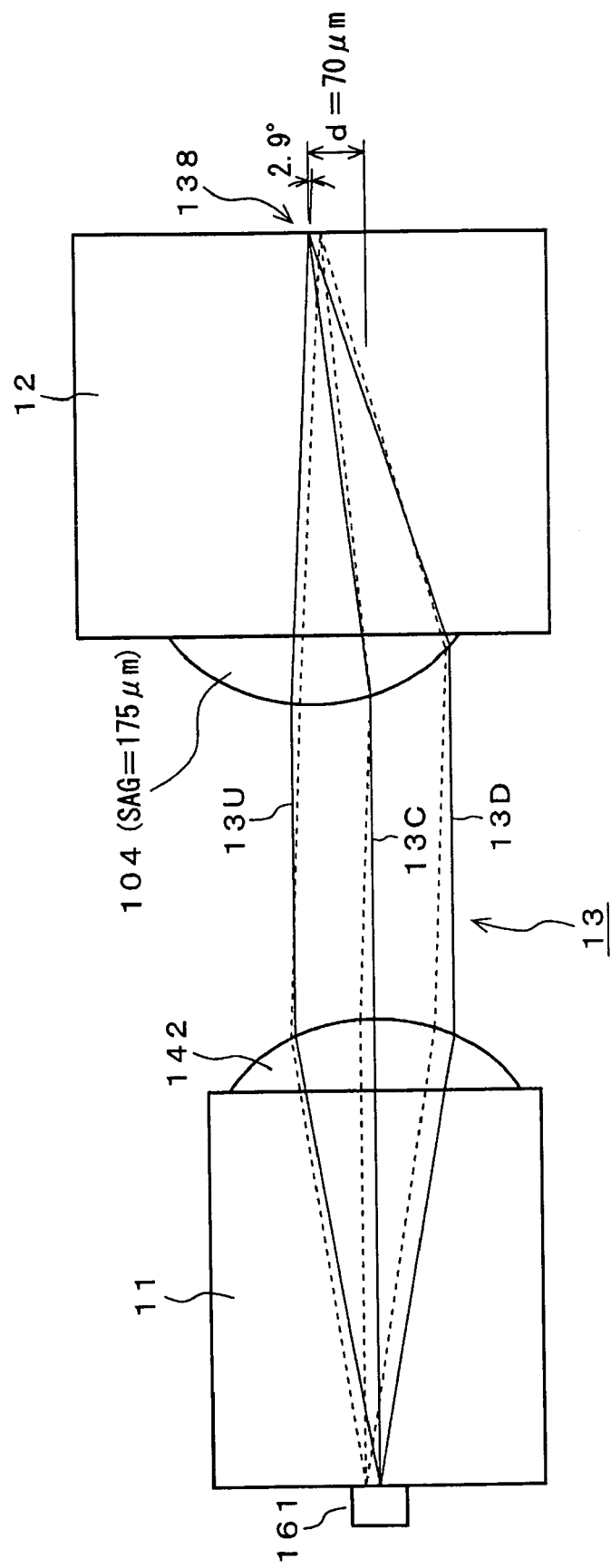
FIG. 21 is a diagram for illustrating another example of the lens assembly in which the condenser lens is redesigned according to the invention.

In this embodiment, since a beam of 6.7 degrees (=9.9°−3.2°) contains in the perfect reflection region, the optical axis of the condenser lens 104 may be shifted by 58.7 μm (=500 μm*tan 6.7°), i.e., about 59 μm or more. Actually, manufacture tolerance, intensity distribution of beam or the like makes the amount of shift optimal. FIG. 21 illustrates a lens assembly in which the amount of shift (the distance d) is 70 μm. In this instance, an incident angle of the upper beam 13U is about 2.9° and a focal diameter is about 30 μm.

The lens assembly thus designed satisfies a focal diameter into the opening 138 of the optical waveguide 135 and a perfect reflection condition on the mirror surface 135a.

FIG. 22 shows factors in aspheric function SAG(h) relative to the collimator lens 142 and the condenser lens 104 based on the following equation (2):

$$SAG(h) = \frac{Cv^x h^2}{1 + \sqrt{1 - Cv^2_{x(K+1)}}} + A_x h^4 \qquad (2)$$

The following will describe a case where a diameter of the condenser lens 104 increases according to a shift of an optical axis of the condenser lens 104 with reference to FIGS. 23A, 23B, 24A, 24B, 25A, and 25B.

It is conceivable that the shift of the optical axis of the condenser lens 104 may cause the diameter thereof to increase, thereby limiting concentration in the optical waveguides. These FIGS. 23A, 23B respectively illustrate a diameter of the condenser lens 104 and an incident region of parallel light 13 (collimated light) before and after shifting the optical axis of the condenser lens 104. FIG. 23A illustrates a situation where the optical axis of the condenser lens 104 has not been shifted. In this situation, a diameter of the condenser lens 104 is small and the parallel light 13 may be incident to a center region of the condenser lens 104.

FIG. 23B illustrates a situation where the optical axis of the condenser lens 104 has been shifted. In this situation, a diameter of the condenser lens 104 is to be larger and the parallel light 13 may be incident to a region getting out of the center of the condenser lens 104. It is to be noted that a circle indicated by dotted line in FIG. 23B indicates a condenser lens 104 when the optical axis of the condenser lens 104 has not been shifted, for comparison. As seen from FIG. 23B, even if the diameter of the condenser lens 104 is to be larger, only a region indicated as a circle P1 shown in FIG. 23B by an alternate long and short dash line increases in a region to be used in the condenser lens 104.

Figure 24A:
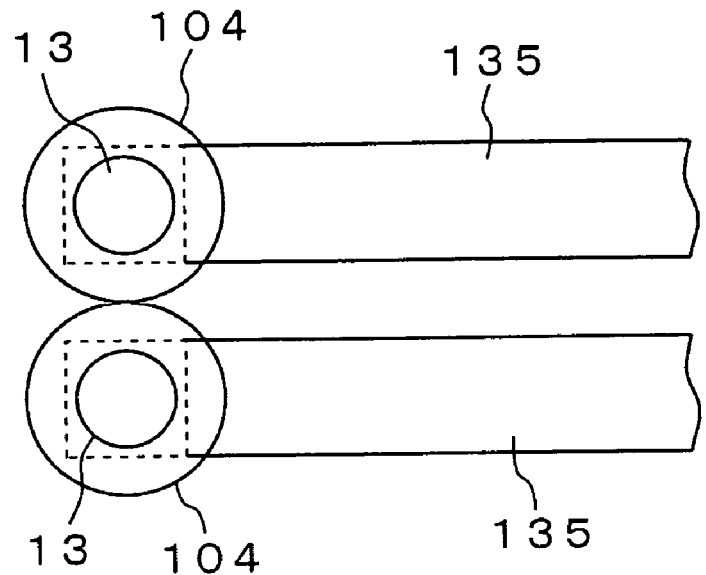
FIG. 24A is a diagram for illustrating an interference between the condenser lenses before shifting the optical axis of any one of the condenser lenses and FIG. 24B is a diagram for illustrating an interference between the condenser lenses after shifting the optical axis of any one of the condenser lenses.
Figure 24B:
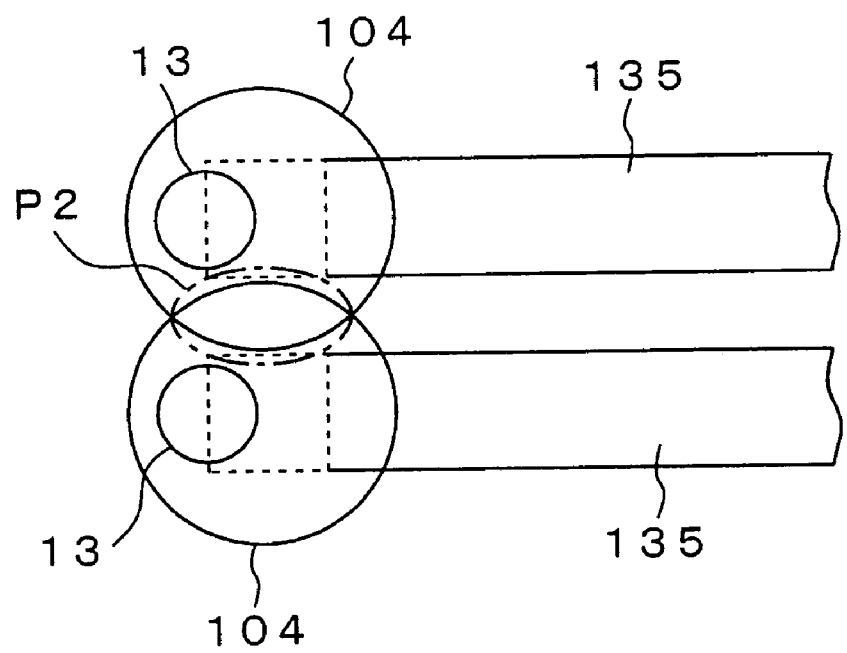

The FIGS. 24A, 24B respectively illustrate a diameter of the condenser lens 104 and an incident region of parallel light 13 (collimated light) before and after shifting the optical axis of the condenser lens 104 if the condenser lenses 104 are arranged like an array corresponding to the end surfaces of respective optical waveguides 135 in the optical waveguide array. FIG. 24A illustrates a situation where the optical axis of the condenser lenses 104 have not been shifted. In this situation, a diameter of each of the condenser lenses 104 is small and the condenser lenses 104 have not yet been interfered.

FIG. 24B illustrates a situation where the optical axis of the condenser lenses 104 have been shifted. In this situation, a diameter of each of the condenser lenses 104 is to be larger and the condenser lenses 104 have been interfered. Only a region indicated as a circle P2 shown in FIG. 24B by an alternate long and short dash line, however, is a regions thus interfered, to which the parallel light is not incident, that is not actually used. Therefore, this causes no problem. In this embodiment, it is possible to use as the condenser lenses 104 only regions, to which the parallel light is incident, that are actually used. This prevents the condenser lenses 104 from being interfered.

Thus, even if a diameter of each of the condenser lenses 104 is larger after an optical axis of any of the condenser lenses 104 has been shifted and the condenser lenses 104 have been interfered, the interfered region is not a region, to which the parallel light is incident, that is actually used. Therefore, even if a diameter of each of the condenser lenses 104 is larger after an optical axis of any of the condenser lenses 104 has been shifted, any concentration of the optical waveguides 135 does not decrease in the optical waveguide array.

Figure 25A:
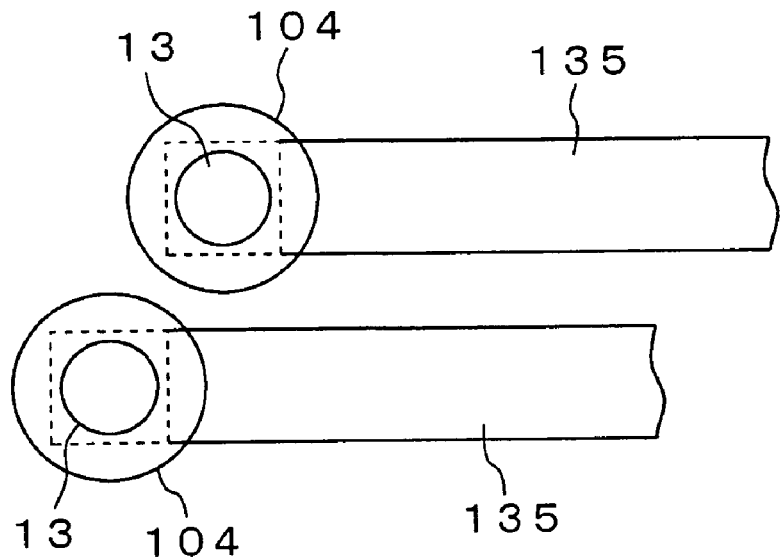
FIG. 25A is a diagram for illustrating an interference between the condenser lenses before shifting the optical axis of any one of the condenser lenses and FIG. 25B is a diagram for illustrating an interference between the condenser lenses after shifting the optical axis of any one of the condenser lenses.
Figure 25B:
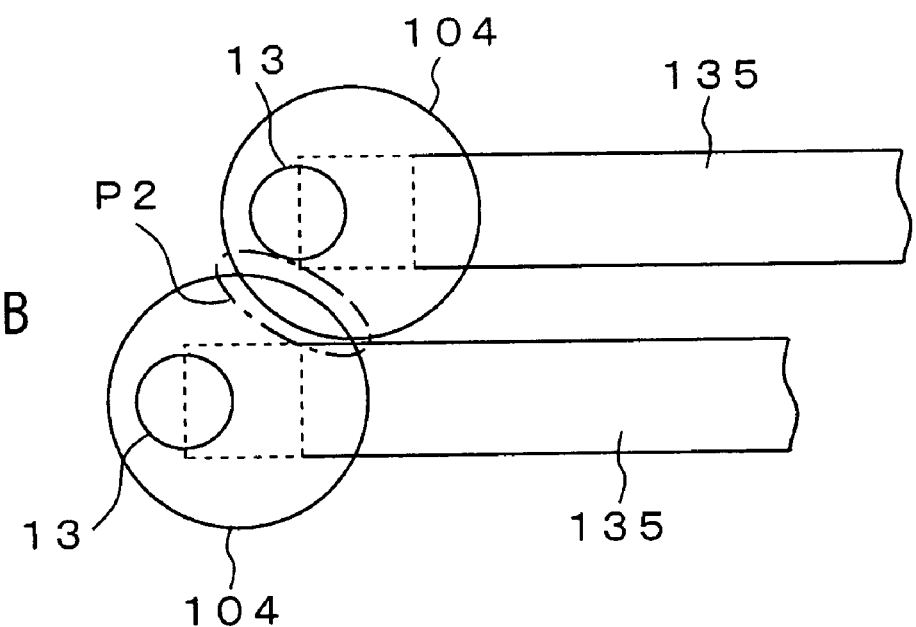

The FIGS. 25A and 25B respectively illustrate a diameter of the condenser lens 104 and an incident region of parallel light 13 (collimated light) before and after shifting any optical axis of the condenser lenses 104 if the condenser lenses 104 are arranged like an array corresponding to the end surfaces of respective optical waveguides 135 in the optical waveguide array when the end surfaces of respective adjacent optical waveguides 135 are shifted to each other along a longitudinal direction of the optical waveguide 135.

To an embodiment shown in FIGS. 25A and 25B, similarity to the one indicated relative to the embodiment shown in FIGS. 24A and 24B is also applied, a detailed explanation of which will be omitted.

The following will describe allowable range on the manufacture tolerance.

Figure 26:
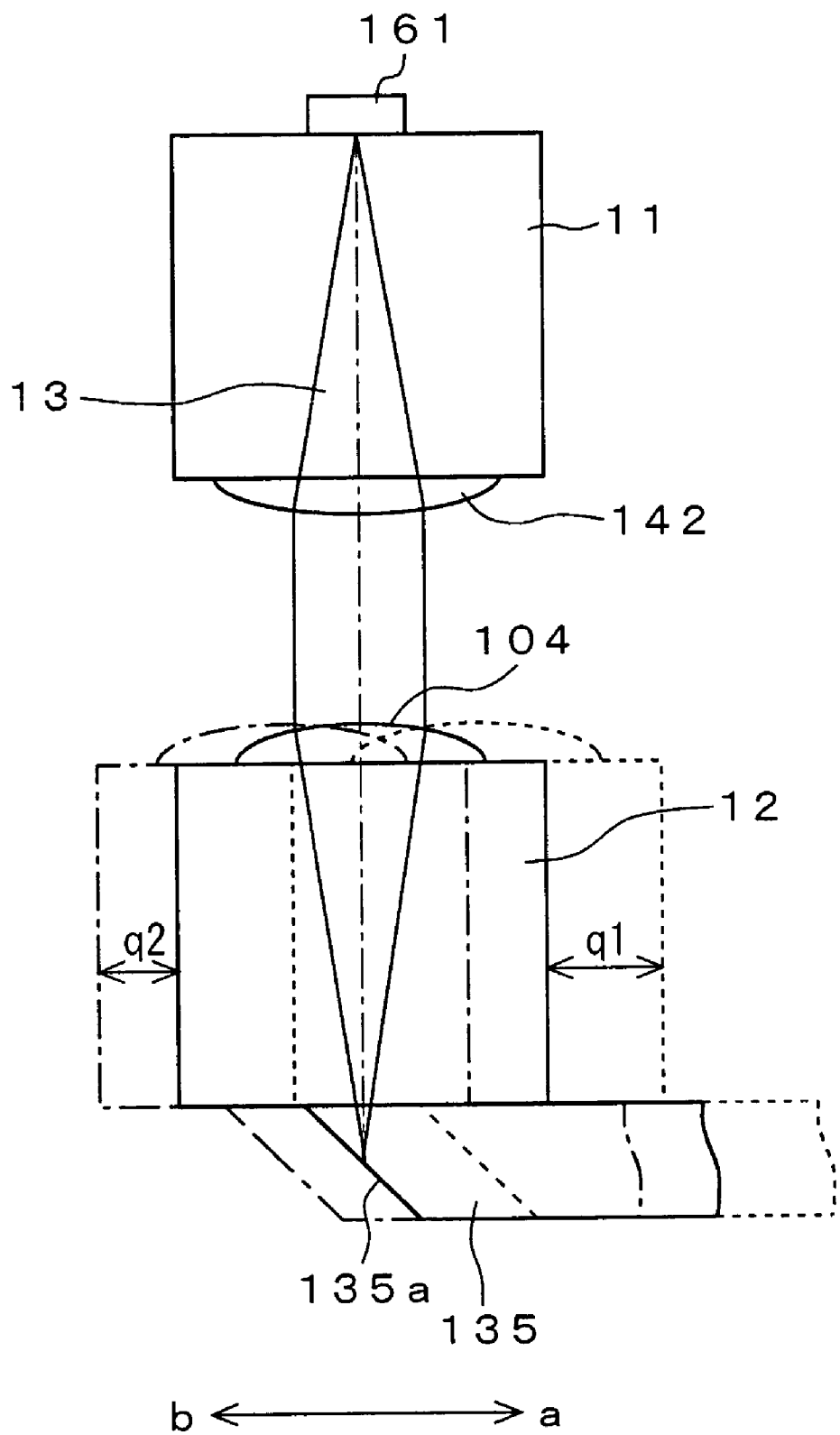
FIG. 26 is a diagram for illustrating an allowable region of manufacture tolerance in the lens assembly when an optical axis of the condenser lens is not shifted.

First, a case where an optical axis of the condenser lens 104 has not been shifted as the past one will be described with reference to FIG. 26. In this case, as described above, if taking into consideration any perfect reflection on the mirror surface 135a, the illustrated lens assembly is wrong according to a shifted direction of the condenser lens 104 so that an amount of the light passing through the mirror surface increases without performing any perfect reflection on the mirror surface when any manufacture tolerance occurs. In other words, this lens assembly is strongly tolerant towards any manufacture tolerance where the optical axis of the condenser lens 104 is shifted towards "a" side shown in FIG. 26 by the dotted line while it is weakly tolerant towards any manufacture tolerance where the optical axis of the condenser lens 104 is shifted towards "b" side shown in FIG. 26 by the alternate long and short dash line. Allowable range on the manufacture tolerance where the optical axis of the condenser lens 104 is shifted towards the "a" side is indicated by q1 while allowable range on the manufacture tolerance where the optical axis of the condenser lens 104 is shifted towards the "b" side is indicated by q2. In this instance, q2<q1 is obtained. As a result thereof, allowable range on the manufacture tolerance for the lens assembly is q2.

Figure 27:
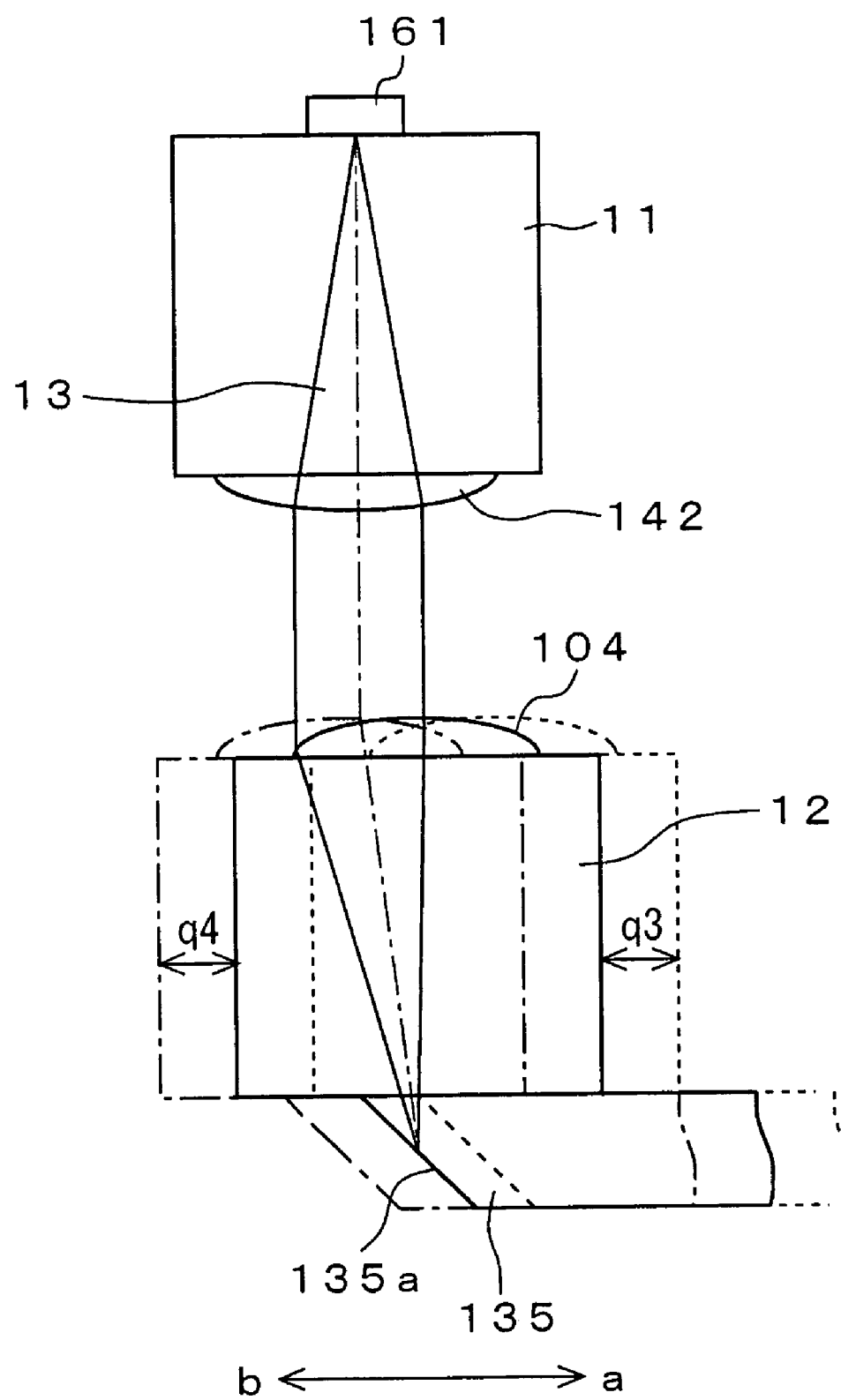
FIG. 27 is a diagram for illustrating an allowable region of manufacture tolerance in the lens assembly when an optical axis of the condenser lens is shifted.

Next, a case where an optical axis of the condenser lens 104 is shifted as an embodiment of this invention will be described with reference to FIG. 27. In this embodiment, an amount of shifting the optical axis of the condenser lens 104 is designed taking into consideration any perfect reflection on the mirror surface 135a. Allowable range q3 on manufacture tolerance where the optical axis of the condenser lens 104 is shifted towards "a" side shown in FIG. 27 by the dotted line equals to allowable range q4 of manufacture tolerance where the optical axis of the condenser lens 104 is shifted towards "b" side shown in FIG. 27 by the alternate long and short dash line. Therefore, allowable range on the manufacture tolerance for the lens assembly is q4.

However, when q3=q4, it is possible to shift the optical axis of the condenser lens 104 so that the main beam 13C of the optical signal 13 is put on the ideal main beam position (see FIG. 20). When the optical axis of the condenser lens 104 is practically shifted, q4<q3 is obtained (see FIG. 21). If, however, such the case is compared with the case where the optical axis of the condenser lens 104 is not shifted as illustrated in FIG. 26, q2<q4 is obtained, so that if the optical axis of the condenser lens 104 is shifted, allowable range on the manufacture tolerance for the lens assembly can increase, thereby allowing the lens assembly to be made strongly tolerant towards any manufacture tolerance.

According to the above embodiment of photoelectric composite apparatus 100, the optical axis of the lens (the condenser lens) 104 is shifted toward the other end of the optical waveguide 135 by a predetermined distance with respect to an optical axis of the lens (the collimator lens) 142, thereby allowing the optical signal that is incident to the mirror surface to satisfy conditions of perfect reflections without decreasing NA of the lens 104. In this embodiment, no NA of the lens 104 decreases so that focal diameter can become larger at the opening 138 of the waveguide 135 to prevent an amount of the light rejected by the opening 138 from increasing.

Also, according to the above embodiment of photoelectric composite apparatus 100, the optical axis of the lens (the condenser lens) 104 is shifted toward the other end of the optical waveguide 135 by a predetermined distance with respect to an optical axis of the lens (the collimator lens) 142, so that allowable range of the manufacture tolerance where the optical axis of the lens 104 is shifted with respect to an optical axis of the lens 142 can be made larger, thereby allowing the photoelectric composite apparatus 100 to be made strongly tolerant towards any manufacture tolerance.

The following will describe an embodiment of an electronic apparatus to which the photoelectric composite apparatus 100 is actually applicable.

Figure 28:
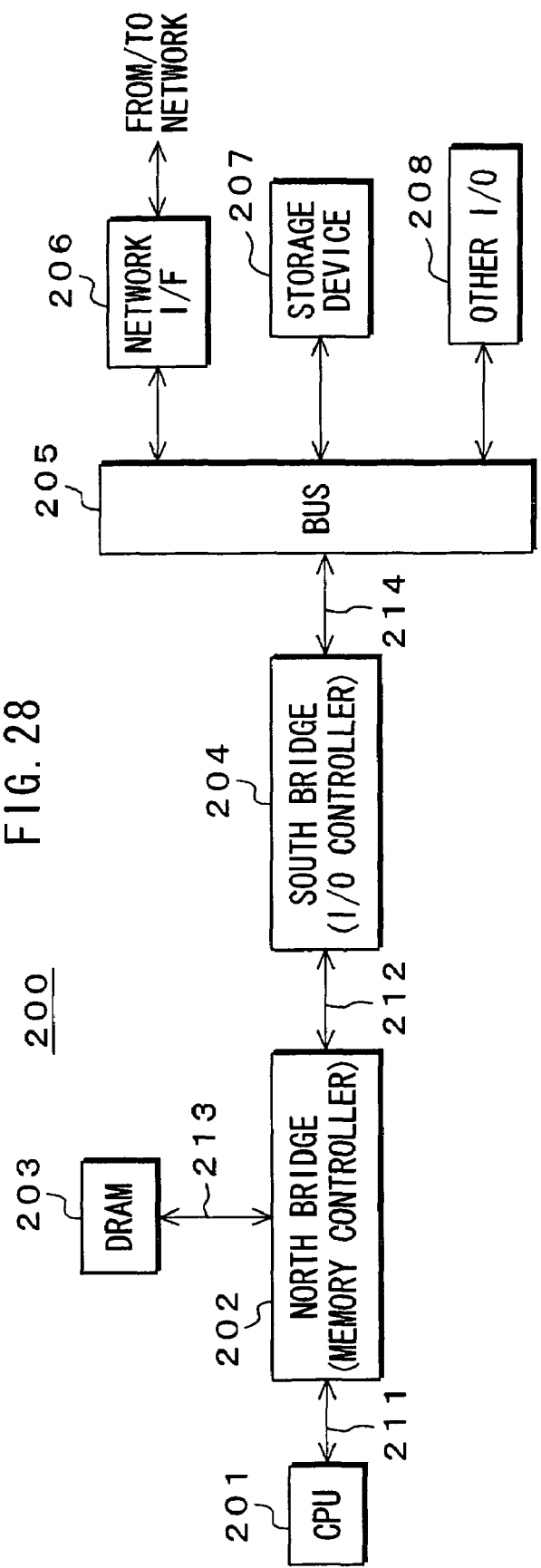
FIG. 28 is a block diagram for illustrating a configuration of an embodiment of a computer system according to the invention.

FIG. 28 illustrates a configuration of a computer system 200 therefor. The computer system 200 has a central processing unit (CPU) 201, a north bridge 202 as a memory controller, a dynamic random access memory (DRAM) 203, a south bridge 204 as an I/O controller, a bus 205, a network interface (network I/F) 206, storage device 207, and other input/output (I/O) device 208.

The north bridge 202 is connected to the CPU 204 through an optical wiring 211. The south bridge 204 is also connected to the north bridge 202 through an optical wiring 212 and connected to the CPU 201 through an optical wiring 211. The DRAM 203 is connected to the north bridge 202 through optical wiring 213. The CPU 201 controls respective units based on an operating system (OS) and various application programs. The north bridge 202 supervises and controls access to the memory 203.

The bus 205 is connected to the south bridge 204 through electric wiring 214. The network I/F 206, the storage device 207, and other I/O device 208 are respectively connected to the bus 205. The storage device 207 includes hard disk drive (HDD), digital versatile disk (DVD) drive, and compact disc (CD) drive. The I/O device 208 includes video input/output device and serial or parallel interface.

Figure 29:
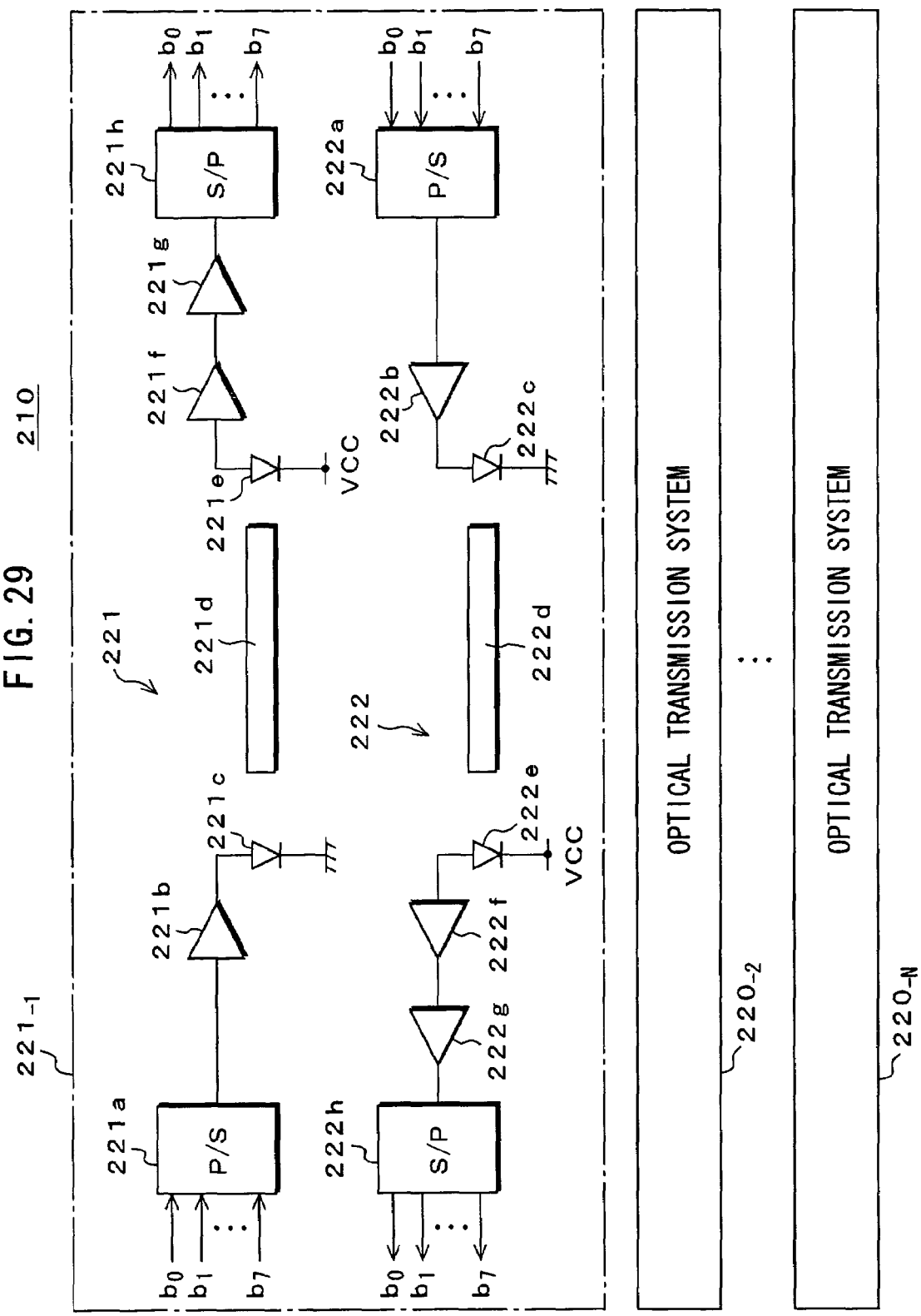
FIG. 29 is a diagram for illustrating a configuration of an embodiment of an optical wiring according to the invention.

FIG. 29 illustrates a configuration of an optical wiring 210 (corresponding to the optical wirings 211 through 213, respectively). This optical wiring 210 has optical transmission systems of N channels, 220-1 through 220-N. Each of the optical transmission systems, 220-1 through 220-N, has a first transmission system 221 for transmitting an optical signal from a first circuit (a first electronic component) to a second circuit (a second electronic component) and a second transmission system 222 for transmitting the optical signal from the second circuit to the second circuit.

The first transmission system 221 has a parallel/serial (P/S) converter 221a, a driver amplifier 221b, a semiconductor laser 221c as a light-emitting element, an optical waveguide 221d, a photodiode 221e as a light-receiving element, a transimpedance amplifier (TIA) 221f, an I/V converter amplifier (IVA) 221g, and a serial/parallel (S/P) converter 221h. In this embodiment, the P/S converter 221a, the driver amplifier 221b, and the semiconductor laser 221c are arranged at the first circuit side while the photodiode 221e, the TIA 221f, the IVA 221g, and the S/P converter 221h are arranged at the second circuit side. The optical waveguide 221d is arranged between the first and second circuits.

Similarly, the second transmission system 222 has a P/S converter 222a, a driver amplifier 222b, a semiconductor laser 222c, an optical waveguide 222d, a photodiode 222e, a TIA 222f, an IVA 222g, and an S/P converter 222h. In this embodiment, the P/S converter 222a, the driver amplifier 222b, and the semiconductor laser 222c are arranged at the second circuit side while the photodiode 222e, the TIA 222f, the IVA 222g, and the S/P converter 222h are arranged at the first circuit side. The optical waveguide 222d is arranged between the second and first circuits.

The P/S converters 221a, 222a respectively convert data to be transmitted, for example, eight-bit-parallel data, b0 through b7, into their serial data. The driver amplifiers 221b, 222b respectively drive the semiconductors 221c, 222c based on the serial data obtained by each of the P/S converters 221a, 222a to generate an optical signal corresponding to the serial data from each of the semiconductors 221c, 222c. The TIAs 221f, 222f, respectively performs an impedance matching when an electric current signal photo-electrically converted by each of the photodiodes 221e, 222e is supplied to each of the following IVAs 221g, 222g. The IVAs 221g, 222g, respectively convert the electric current signal output from each of the TIAs 221f, 222f into a voltage signal. The S/P converters, 221h, 222h, respectively convert the transmitted serial data, which is an output signal from each of the IVAs 221g, 222g, into parallel data.

The following will describe operations when the data is transmitted from the first circuit to the second circuit. On the first circuit side, the P/S converter 221a converts the eight-bit-parallel data to be transmitted, into the serial data, which is supplied to the driver amplifiers 221b. The driver amplifier 221b drives the semiconductor 221c to generate an optical signal corresponding to the serial data from the semiconductor 221c. This optical signal is transmitted to the second circuit side via the optical waveguide 221d.

On the second circuit side, the optical signal transmitted through the optical waveguide 221d is irradiated to the photodiode 221e. The electric current signal photo-electrically converted by the photodiode 221e is supplied to the IVAs 221g, through the TIA 221f for impedance matching, where the electric current signal is converted into a voltage signal. The S/P converter 221h then converts the transmitted serial data, which is an output signal from the IVA 221g, into parallel data.

Thus, the data may be transmitted from the first circuit to the second circuit. It is to be noted that similar operations are performed when the data is transmitted from the second circuit to the first circuit, detailed explanation of which will be omitted. Since the optical wiring 210, shown in FIG. 29, has optical transmission systems of N channels, 220-1 through 220-N, parallel data transmission and reception of N channels can be simultaneously performed.

In the above compute system 200, semiconductor chips each constituting the CPU 201, the north bridge 202, the DRAM 203, the south bridge 204, and the bus 205 as the above electronic components are installed on a printed-wiring board (mother board), which is not shown. In this embodiment, the photoelectric composite apparatus 100 shown in FIG. 8 is applicable to a portion including the CPU 201, the north bridge 202, the DRAM 203, and the south bridge 204 so that an excellent signal transfer can be done between the CPU 201 and the north bridge 202, between the DRAM 203 and the north bridge 202, and between the north bridge 202 and the south bridge 204.

Figure 30:
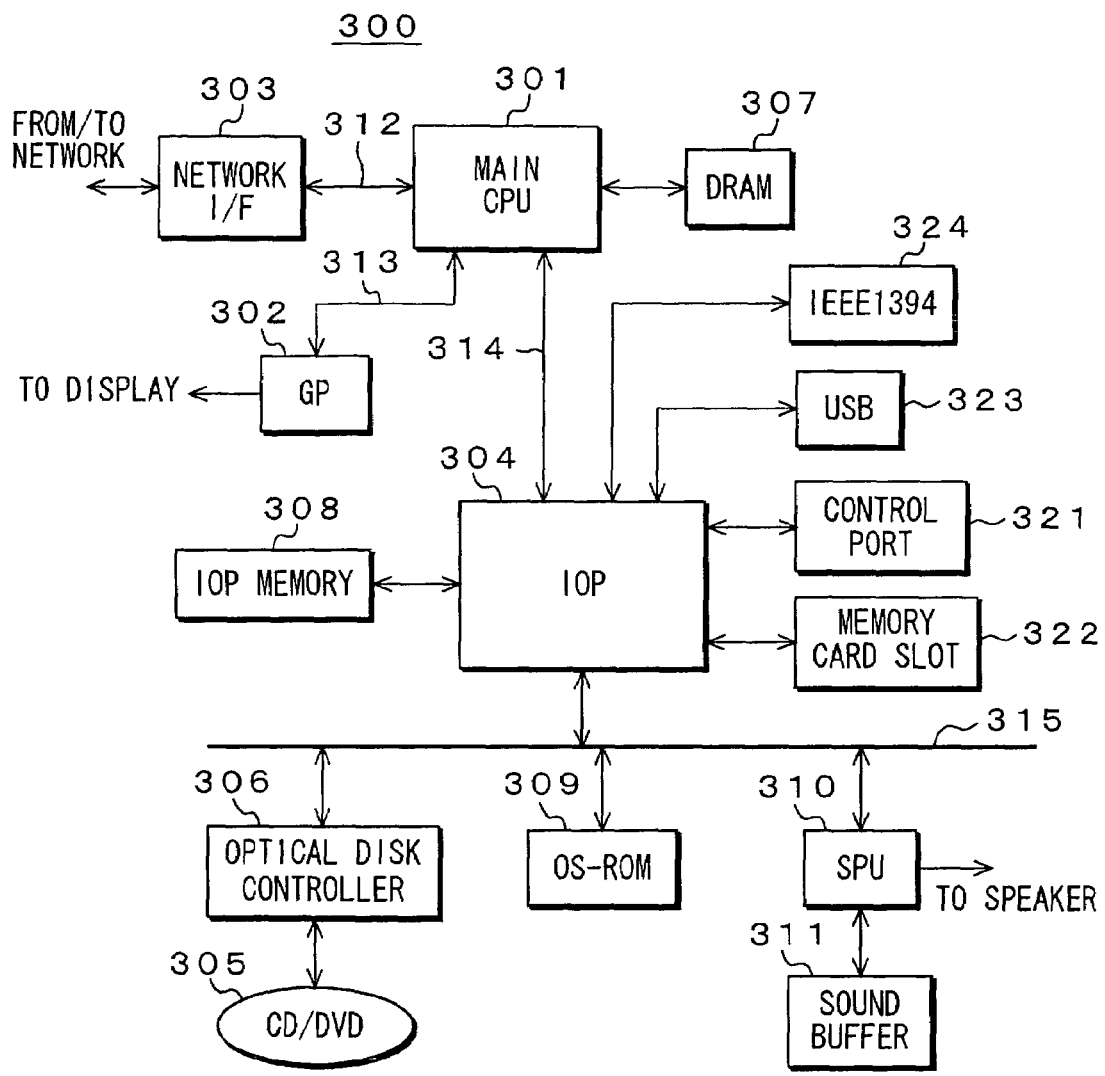
FIG. 30 is a block diagram for illustrating a configuration of an embodiment of a game machine according to the invention.

FIG. 30 illustrates a configuration of a game machine 300. This game machine 300 basically has a main CPU 301 for performing signal processing and controlling internal elements based on various kinds of application programs such as game application programs, a graphic processor (GP) 302 for performing graphic processing, a network interface (a network I/F) 303 for interfacing networks such as the Internet, an 10 processor (IOP) 304 for performing any interface processing, an optical disc controller 306 for controlling reading out of an optical disc 305 such as DVD or CD and decoding the data read out thereof, a DRAM 307 as a main memory that is connected to the main CPU 301, an IOP memory 308 for mainly storing any commands and data that are to be used in 10 processor 304, an OS-ROM 309 for storing any program for operating system, a sound processor unit (SPU) 310 for performing any sound signal processing, and a sound buffer 311 for storing any compressed waveform data.

The main CPU 301 is connected to the network I/F 303 via an optical wiring 312. The main CPU 301 is also connected to the GP 302 via an optical wiring 313. The main CPU 301 is further connected to the 10 processor 304 via an SBUS 314. The main CPU 301 is additionally connected to the optical disc controller 306, the OS-ROM 309, and the SPU 310 via an SSBUS 315.

The main CPU runs any program stored in the OS-ROM 309, various kinds of game application programs read out of the optical disc 305 and loaded in DRAM 307 or downloaded via a communication network, and the like. The GP 302 performs, for example, rendering for video games and transmits video signals to a display.

To IO processor 304, a controller port 321 that is connected to a controller, which is not shown, a memory card slot 32 to be equipped with a memory card, which is not shown, a USB terminal 323, and an IEEE 1394 terminal 324 are connected. This allows the IO processor 304 to perform transmission and reception of data or a protocol transfer among the controller connected via the controller port 321, the memory card connected via the memory card slot 322, and a cellular phone and a personal computer that are connected via the USB terminal 323.

The SPU 310 reproduces the compressed waveform data stored in the sound buffer 311 using a set sampling frequency based on commands from the main CPU 301 to synthesize various sounds and output audio signals through a speaker.

It is to be noted that the optical wirings 312, 313 have respectively configurations shown in FIG. 29 so that the data can be transmitted and received using an optical signal between the main CPU 301 and the network I/F 303 and between the main CPU and the GP 302.

In the above game machine 300, a semiconductor chip constituting the main CPU 301 as the above basic electronic component or the like is installed on a printed-wiring board (mother board), which is not shown.

In this embodiment, the photoelectric composite apparatus 100 shown in FIG. 8 is applicable to a portion including the main CPU 301, the GP 302, and the network I/F 303 so that an excellent signal transfer using the optical signal can be done between the main CPU 301 and the network I/F 303, and between the main CPU 301 and the GP 302.

Figure 31:
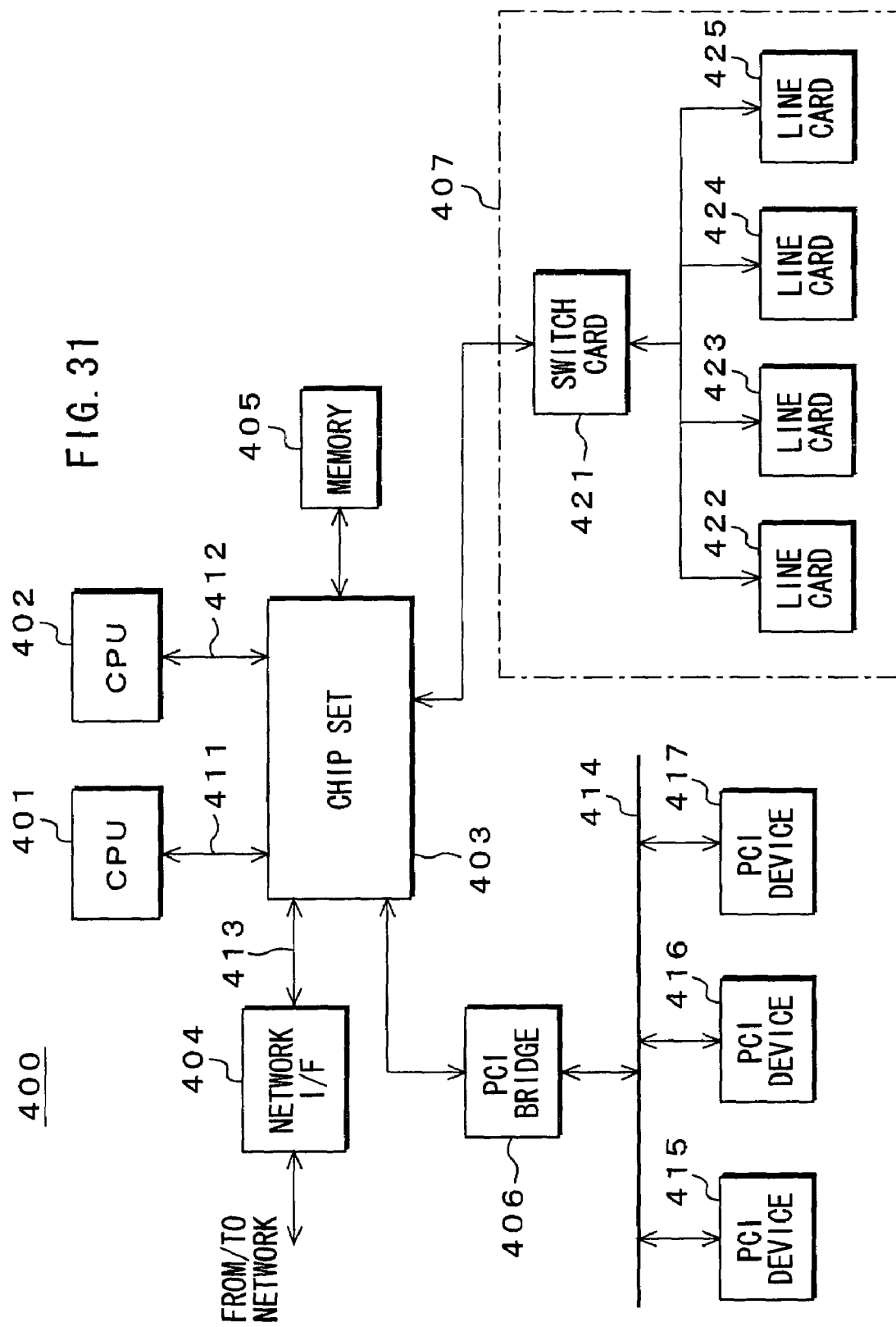
FIG. 31 is a block diagram for illustrating a configuration of an embodiment of a server according to the invention.

FIG. 31 illustrates a configuration of a server 400. The server 400 basically has CPUs 401, 402, a chip set 403, a network interface (a network I/F) 404, a memory 405, a PCI bridge 406, and a router 407.

The chip set 403 is connected to the CPUs 401, 402 through optical wirings 411, 412, respectively, and is also connected to the network I/F 404 through optical wiring 413. The chip set 403 is connected to the memory 405, the PCI bridge 406, and the router 407, respectively, through electric wirings. The network I/F 404 performs an interface to a network. The chip set 403 controls the CPUs 401, 402, the network I/F 404, the memory 405, the PCI bridge 406 and the like.

To PCI bridge 406, PCI devices 415, 416 and 417 such as a storage device are connected via PCI bus 414. The router 407 is constituted of, for example, a switch card 421 and line cards 422 through 425. The line cards 422 through 425 are processors that perform preprocessing for packets and the switch card is a switch for switching a destination of packet according to its address.

It is to be noted that the optical wirings 411 trough 413 respectively have configurations shown in FIG. 29 so that the data can be transmitted and received using an optical signal between each of the CPUs 401, 402 and the chip set 403 and between the chip set 403 and the network I/F 404.

In the above server 400, semiconductor chips constituting the CPUs 401, 402 and the chip set 403 as the above basic electronic component or the like is installed on a printed-wiring board (mother board), which is not shown.

In this embodiment, the photoelectric composite apparatus 100 shown in FIG. 8 is applicable to a portion including the CPUs 401, 402, the chip set 403, and the network I/F 404 so that an excellent signal transfer using the optical signal can be done between each of the CPUs 401, 402 and the chip set 403, and between the chip set 403 and the network I/F 404.

Thus has been described the lens assembly for transmitting an optical signal or the like wherein the optical signal diffused out of the light-emitting element is converted from its diffused light into parallel light by the collimator lens and this parallel light is focused into an opening of an optical waveguide, which is provided in an end of the optical waveguide, by the condenser lens, thereby allowing the optical signal that is incident to the mirror surface in the optical waveguide to satisfy conditions of perfect reflections without decreasing NA of the lens 104. Such the lens assembly for transmitting an optical signal or the like is preferably applicable to an optical signal transfer between semiconductor chips such as LSI.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A lens assembly for transmitting an optical signal, said lens assembly comprising:

a light-emitting element that diffuses the optical signal;

a collimator lens that converts the optical signal diffused out of the light-emitting element from a diffused light into a parallel light; and a condenser lens that gathers the parallel light output from the collimator lens to focus the parallel light into an opening of an optical waveguide, said opening being provided in a first end of the optical waveguide, wherein an optical axis of the condenser lens is shifted toward a second end of the waveguide by a predetermined distance with respect to an optical axis of the collimator lens, and wherein the predetermined distance is set to put a main beam of the optical signal on a position of a first line, said optical signal being incident to an inclined mirror surface to which the optical signal focused into the optical waveguide through the opening is incident, said first line halving a region covering from a second line indicating a critical angle with respect to the mirror surface to a third line extending along the mirror surface.

2. The lens assembly according to claim 1, wherein the predetermined distance is set to provide an incline of a main beam of the optical signal with respect to the optical axis of the condenser lens not larger than an incline of a first line with respect to the optical axis of the condenser lens, said optical signal being incident to an inclined mirror surface to which the optical signal focused into the optical waveguide through the opening is incident, said first line halving a region covering from a second line indicating a critical angle with respect to the mirror surface to a third line extending along the mirror surface.

* * * * *